(12) United States Patent
Duffy et al.

(10) Patent No.: US 7,877,722 B2
(45) Date of Patent: Jan. 25, 2011

(54) SYSTEMS AND METHODS FOR CREATING INSPECTION RECIPES

(75) Inventors: Brian Duffy, San Jose, CA (US); Ashok Kulkarni, San Jose, CA (US)

(73) Assignee: KLA-Tencor Corp., San Jose, CA (US)

( * ) Notice: Subject to any disclaimer, the term of this patent is extended or adjusted under 35 U.S.C. 154(b) by 447 days.

(21) Appl. No.: 11/960,157

(22) Filed: Dec. 19, 2007

(65) Prior Publication Data

US 2008/0250384 A1 Oct. 9, 2008

Related U.S. Application Data

(60) Provisional application No. 60/870,724, filed on Dec. 19, 2006.

(51) Int. Cl.
*G06F 17/50* (2006.01)
(52) U.S. Cl. ......................................................... 716/21
(58) Field of Classification Search ................... 716/21
See application file for complete search history.

(56) References Cited

U.S. PATENT DOCUMENTS

| | | | |
|---|---|---|---|
| 3,495,269 A | 2/1970 | Mutschler et al. | |
| 3,496,352 A | 2/1970 | Jugle | |
| 3,909,602 A | 9/1975 | Micka | |
| 4,015,203 A | 3/1977 | Verkuil | |
| 4,247,203 A | 1/1981 | Levy et al. | |
| 4,347,001 A | 8/1982 | Levy et al. | |
| 4,378,159 A | 3/1983 | Galbraith | |
| 4,448,532 A | 5/1984 | Joseph et al. | |
| 4,532,650 A | 7/1985 | Wihl et al. | |
| 4,555,798 A | 11/1985 | Broadbent, Jr. et al. | |
| 4,578,810 A | 3/1986 | MacFarlane et al. | |
| 4,579,455 A | 4/1986 | Levy et al. | |
| 4,595,289 A | 6/1986 | Feldman et al. | |

(Continued)

FOREIGN PATENT DOCUMENTS

EP 0032197 7/1981

(Continued)

OTHER PUBLICATIONS

Barty et al., "Aerial Image Microscopes for the inspection of defects in EUV masks," Proceedings of SPIE, vol. 4889, 2002, pp. 1073-1084.

(Continued)

*Primary Examiner*—Jack Chiang
*Assistant Examiner*—Brandon W Bowers
(74) *Attorney, Agent, or Firm*—Ann Marie Mewherter

(57) ABSTRACT

Systems and methods for creating inspection recipes are provided. One computer-implemented method for creating an inspection recipe includes acquiring a first design and one or more characteristics of output of an inspection system for a wafer on which the first design is printed using a manufacturing process. The method also includes creating an inspection recipe for a second design using the first design and the one or more characteristics of the output acquired for the wafer on which the first design is printed. The first and second designs are different. The inspection recipe will be used for inspecting wafers after the second design is printed on the wafers using the manufacturing process.

20 Claims, 14 Drawing Sheets

U.S. PATENT DOCUMENTS

| | | | |
|---|---|---|---|
| 4,599,558 A | 7/1986 | Castellano et al. |
| 4,633,504 A | 12/1986 | Wihl |
| 4,641,353 A | 2/1987 | Kobayashi |
| 4,641,967 A | 2/1987 | Pecen |
| 4,734,721 A | 3/1988 | Boyer et al. |
| 4,758,094 A | 7/1988 | Wihl |
| 4,766,324 A | 8/1988 | Saadat et al. |
| 4,799,175 A | 1/1989 | Sano et al. |
| 4,805,123 A | 2/1989 | Specht et al. |
| 4,812,756 A | 3/1989 | Curtis et al. |
| 4,814,829 A | 3/1989 | Kosugi et al. |
| 4,817,123 A | 3/1989 | Sones et al. |
| 4,845,558 A | 7/1989 | Tsai et al. |
| 4,877,326 A | 10/1989 | Chadwick et al. |
| 4,926,489 A | 5/1990 | Danielson et al. |
| 4,928,313 A | 5/1990 | Leonard et al. |
| 5,046,109 A | 9/1991 | Fujimori et al. |
| 5,189,481 A | 2/1993 | Jann et al. |
| 5,444,480 A | 8/1995 | Sumita |
| 5,453,844 A | 9/1995 | George et al. |
| 5,459,520 A | 10/1995 | Sasaki |
| 5,481,624 A | 1/1996 | Kamon |
| 5,485,091 A | 1/1996 | Verkuil |
| 5,528,153 A | 6/1996 | Taylor et al. |
| 5,544,256 A | 8/1996 | Brecher et al. |
| 5,563,702 A | 10/1996 | Emery et al. |
| 5,572,598 A | 11/1996 | Wihl et al. |
| 5,578,821 A | 11/1996 | Meisberger et al. |
| 5,594,247 A | 1/1997 | Verkuil et al. |
| 5,608,538 A | 3/1997 | Edger et al. |
| 5,619,548 A | 4/1997 | Koppel |
| 5,621,519 A | 4/1997 | Frost et al. |
| 5,644,223 A | 7/1997 | Verkuil |
| 5,650,731 A | 7/1997 | Fung |
| 5,661,408 A | 8/1997 | Kamieniecki et al. |
| 5,689,614 A | 11/1997 | Gronet et al. |
| 5,694,478 A | 12/1997 | Braier et al. |
| 5,696,835 A | 12/1997 | Hennessey et al. |
| 5,703,969 A | 12/1997 | Hennessey et al. |
| 5,737,072 A | 4/1998 | Emery et al. |
| 5,742,658 A | 4/1998 | Tiffin et al. |
| 5,754,678 A | 5/1998 | Hawthorne et al. |
| 5,767,691 A | 6/1998 | Verkuil |
| 5,767,693 A | 6/1998 | Verkuil |
| 5,771,317 A | 6/1998 | Edgar |
| 5,773,989 A | 6/1998 | Edelman et al. |
| 5,774,179 A | 6/1998 | Chevrette et al. |
| 5,795,685 A | 8/1998 | Liebmann et al. |
| 5,834,941 A | 11/1998 | Verkuil |
| 5,852,232 A | 12/1998 | Samsavar et al. |
| 5,866,806 A | 2/1999 | Samsavar et al. |
| 5,874,733 A | 2/1999 | Silver et al. |
| 5,884,242 A | 3/1999 | Meier et al. |
| 5,889,593 A | 3/1999 | Bareket |
| 5,932,377 A | 8/1999 | Ferguson et al. |
| 5,940,458 A | 8/1999 | Suk |
| 5,948,972 A | 9/1999 | Samsavar et al. |
| 5,955,661 A | 9/1999 | Samsavar et al. |
| 5,965,306 A | 10/1999 | Mansfield et al. |
| 5,980,187 A | 11/1999 | Verhovsky |
| 5,986,263 A | 11/1999 | Hiroi et al. |
| 5,991,699 A | 11/1999 | Kulkarni et al. |
| 6,011,404 A | 1/2000 | Ma et al. |
| 6,014,461 A | 1/2000 | Hennessey et al. |
| 6,052,478 A | 4/2000 | Wihl et al. |
| 6,060,709 A | 5/2000 | Verkuil et al. |
| 6,072,320 A | 6/2000 | Verkuil |
| 6,076,465 A | 6/2000 | Vacca et al. |
| 6,078,738 A | 6/2000 | Garza et al. |
| 6,091,257 A | 7/2000 | Verkuil et al. |
| 6,091,846 A | 7/2000 | Lin et al. |
| 6,097,196 A | 8/2000 | Verkuil et al. |
| 6,097,887 A | 8/2000 | Hardikar et al. |
| 6,104,206 A | 8/2000 | Verkuil |
| 6,104,835 A | 8/2000 | Han |
| 6,121,783 A | 9/2000 | Horner et al. |
| 6,122,017 A | 9/2000 | Taubman |
| 6,122,046 A | 9/2000 | Almogy |
| 6,137,570 A | 10/2000 | Chuang et al. |
| 6,141,038 A | 10/2000 | Young et al. |
| 6,146,627 A | 11/2000 | Muller |
| 6,171,737 B1 | 1/2001 | Phan et al. |
| 6,175,645 B1 | 1/2001 | Elyasaf et al. |
| 6,184,929 B1 | 2/2001 | Noda et al. |
| 6,184,976 B1 | 2/2001 | Park et al. |
| 6,191,605 B1 | 2/2001 | Miller et al. |
| 6,201,999 B1 | 3/2001 | Jevtic |
| 6,202,029 B1 | 3/2001 | Verkuil et al. |
| 6,205,239 B1 | 3/2001 | Lin et al. |
| 6,224,638 B1 | 5/2001 | Jevtic et al. |
| 6,233,719 B1 | 5/2001 | Hardikar et al. |
| 6,248,485 B1 | 6/2001 | Cuthbert |
| 6,248,486 B1 | 6/2001 | Dirksen et al. |
| 6,259,960 B1 | 7/2001 | Inokuchi |
| 6,266,437 B1 | 7/2001 | Elchel et al. |
| 6,267,005 B1 | 7/2001 | Samsavar et al. |
| 6,268,093 B1 | 7/2001 | Kenan et al. |
| 6,272,236 B1 | 8/2001 | Pierrat et al. |
| 6,282,309 B1 | 8/2001 | Emery |
| 6,292,582 B1 | 9/2001 | Lin et al. |
| 6,324,298 B1 | 11/2001 | O'Dell et al. |
| 6,344,640 B1 | 2/2002 | Rhoads |
| 6,363,166 B1 | 3/2002 | Wihl et al. |
| 6,373,975 B1 | 4/2002 | Bula et al. |
| 6,415,421 B2 | 7/2002 | Anderson et al. |
| 6,445,199 B1 | 9/2002 | Satya et al. |
| 6,451,690 B1 | 9/2002 | Matsumoto |
| 6,466,314 B1 | 10/2002 | Lehman |
| 6,466,315 B1 | 10/2002 | Karpol et al. |
| 6,470,489 B1 | 10/2002 | Chang et al. |
| 6,483,938 B1 | 11/2002 | Hennessey et al. |
| 6,513,151 B1 | 1/2003 | Erhardt et al. |
| 6,526,164 B1 | 2/2003 | Mansfield et al. |
| 6,529,621 B1 | 3/2003 | Glasser et al. |
| 6,535,628 B2 | 3/2003 | Smargiassi et al. |
| 6,539,106 B1 | 3/2003 | Gallarda et al. |
| 6,569,691 B1 | 5/2003 | Jastrzebski et al. |
| 6,581,193 B1 | 6/2003 | McGhee et al. |
| 6,593,748 B1 | 7/2003 | Halliyal et al. |
| 6,597,193 B2 | 7/2003 | Lagowski et al. |
| 6,602,728 B1 | 8/2003 | Liebmann et al. |
| 6,608,681 B2 | 8/2003 | Tanaka et al. |
| 6,614,520 B1 | 9/2003 | Bareket et al. |
| 6,631,511 B2 | 10/2003 | Haffner |
| 6,636,301 B1 | 10/2003 | Kvamme et al. |
| 6,642,066 B1 | 11/2003 | Halliyal et al. |
| 6,658,640 B2 | 12/2003 | Weed |
| 6,665,065 B1 | 12/2003 | Phan et al. |
| 6,670,082 B2 | 12/2003 | Liu et al. |
| 6,680,621 B2 | 1/2004 | Savtchouk et al. |
| 6,691,052 B1 | 2/2004 | Maurer |
| 6,701,004 B1 | 3/2004 | Shykind et al. |
| 6,718,526 B1 | 4/2004 | Eldredge et al. |
| 6,721,695 B1 | 4/2004 | Chen et al. |
| 6,734,696 B2 | 5/2004 | Horner et al. |
| 6,751,519 B1 | 6/2004 | Satya et al. |
| 6,753,954 B2 | 6/2004 | Chen |
| 6,757,645 B2 | 6/2004 | Chang |
| 6,759,655 B2 | 7/2004 | Nara et al. |
| 6,771,806 B1 | 8/2004 | Satya et al. |
| 6,775,818 B2 | 8/2004 | Taravade et al. |
| 6,777,147 B1 | 8/2004 | Fonseca et al. |
| 6,777,676 B1 | 8/2004 | Wang et al. |
| 6,778,695 B1 | 8/2004 | Schellenberg et al. |

| | | |
|---|---|---|
| 6,779,159 B2 | 8/2004 | Yokoyama et al. |
| 6,784,446 B1 | 8/2004 | Phan et al. |
| 6,788,400 B2 | 9/2004 | Chen |
| 6,789,032 B2 | 9/2004 | Barbour et al. |
| 6,803,554 B2 | 10/2004 | Ye et al. |
| 6,806,456 B1 | 10/2004 | Ye et al. |
| 6,807,503 B2 | 10/2004 | Ye et al. |
| 6,813,572 B2 | 11/2004 | Satya et al. |
| 6,820,028 B2 | 11/2004 | Ye et al. |
| 6,828,542 B2 | 12/2004 | Ye et al. |
| 6,842,225 B1 | 1/2005 | Irie |
| 6,859,746 B1 | 2/2005 | Stirton |
| 6,879,924 B2 | 4/2005 | Ye et al. |
| 6,882,745 B2 | 4/2005 | Brankner |
| 6,884,984 B2 | 4/2005 | Ye et al. |
| 6,886,153 B1 | 4/2005 | Bevis |
| 6,892,156 B2 | 5/2005 | Ye et al. |
| 6,902,855 B2 | 6/2005 | Peterson et al. |
| 6,906,305 B2 | 6/2005 | Pease et al. |
| 6,918,101 B1 | 7/2005 | Satya et al. |
| 6,948,141 B1 | 9/2005 | Satya et al. |
| 6,959,255 B2 | 10/2005 | Ye et al. |
| 6,966,047 B1 | 11/2005 | Glasser |
| 6,969,837 B2 | 11/2005 | Ye et al. |
| 6,969,864 B2 | 11/2005 | Ye et al. |
| 6,983,060 B1 | 1/2006 | Martinent-Catalot et al. |
| 6,988,045 B2 | 1/2006 | Purdy |
| 7,003,755 B2 | 2/2006 | Pang et al. |
| 7,003,758 B2 | 2/2006 | Ye et al. |
| 7,012,438 B1 | 3/2006 | Miller et al. |
| 7,026,615 B2 | 4/2006 | Takane |
| 7,027,143 B1 | 4/2006 | Stokowski et al. |
| 7,030,966 B2 | 4/2006 | Hansen |
| 7,030,997 B2 | 4/2006 | Neureuther et al. |
| 7,053,355 B2 | 5/2006 | Ye et al. |
| 7,061,625 B1 | 6/2006 | Hwang |
| 7,103,484 B1 | 9/2006 | Shi et al. |
| 7,106,895 B1 | 9/2006 | Goldberg et al. |
| 7,107,517 B1 | 9/2006 | Suzuki et al. |
| 7,107,571 B2 | 9/2006 | Chang et al. |
| 7,111,277 B2 | 9/2006 | Ye et al. |
| 7,114,145 B2 | 9/2006 | Ye et al. |
| 7,117,477 B2 | 10/2006 | Ye et al. |
| 7,117,478 B2 | 10/2006 | Ye et al. |
| 7,120,285 B1 | 10/2006 | Spence |
| 7,120,895 B2 | 10/2006 | Ye et al. |
| 7,123,356 B1 | 10/2006 | Stokowski |
| 7,124,386 B2 | 10/2006 | Smith |
| 7,133,548 B2 | 11/2006 | Kenan et al. |
| 7,135,344 B2 | 11/2006 | Nehmadi |
| 7,136,143 B2 | 11/2006 | Smith |
| 7,152,215 B2 | 12/2006 | Smith |
| 7,162,071 B2 | 1/2007 | Hung et al. |
| 7,171,334 B2 | 1/2007 | Gassner |
| 7,174,520 B2 | 2/2007 | White |
| 7,194,709 B2 | 3/2007 | Brankner |
| 7,207,017 B1 | 4/2007 | Tabery et al. |
| 7,231,628 B2 | 6/2007 | Pack et al. |
| 7,236,847 B2 | 6/2007 | Marella |
| 7,379,175 B1 | 5/2008 | Stokowski et al. |
| 7,386,839 B1 | 6/2008 | Golender et al. |
| 7,418,124 B2 | 8/2008 | Peterson et al. |
| 7,424,145 B2 | 9/2008 | Horie et al. |
| 2001/0019625 A1 | 9/2001 | Kenan et al. |
| 2001/0022858 A1 | 9/2001 | Komiya et al. |
| 2001/0043735 A1 | 11/2001 | Smargiassi et al. |
| 2002/0019729 A1 | 2/2002 | Chang et al. |
| 2002/0026626 A1 | 2/2002 | Randall et al. |
| 2002/0033449 A1 | 3/2002 | Nakasuji et al. |
| 2002/0035461 A1 | 3/2002 | Chang et al. |
| 2002/0035641 A1 | 3/2002 | Kurose |
| 2002/0088951 A1 | 7/2002 | Chen |
| 2002/0090746 A1 | 7/2002 | Xu et al. |
| 2002/0134936 A1 | 9/2002 | Matsui et al. |
| 2002/0144230 A1 | 10/2002 | Rittman |
| 2002/0164065 A1 | 11/2002 | Cai et al. |
| 2002/0181756 A1 | 12/2002 | Shibuya et al. |
| 2002/0186878 A1 | 12/2002 | Hoon et al. |
| 2002/0192578 A1 | 12/2002 | Tanaka et al. |
| 2003/0014146 A1 | 1/2003 | Fujii |
| 2003/0022401 A1 | 1/2003 | Hamamatsu et al. |
| 2003/0033046 A1 | 2/2003 | Yoshitake et al. |
| 2003/0048458 A1 | 3/2003 | Mieher |
| 2003/0048939 A1 | 3/2003 | Lehman |
| 2003/0057971 A1 | 3/2003 | Nishiyama et al. |
| 2003/0086081 A1 | 5/2003 | Lehman |
| 2003/0098805 A1 | 5/2003 | Bizjak |
| 2003/0128870 A1 | 7/2003 | Pease et al. |
| 2003/0138138 A1 | 7/2003 | Vacca et al. |
| 2003/0138978 A1 | 7/2003 | Tanaka et al. |
| 2003/0169916 A1 | 9/2003 | Hayashi et al. |
| 2003/0192015 A1 | 10/2003 | Liu |
| 2003/0207475 A1 | 11/2003 | Nakasuji et al. |
| 2003/0223639 A1 | 12/2003 | Shlain et al. |
| 2003/0226951 A1 | 12/2003 | Ye et al. |
| 2003/0228714 A1 | 12/2003 | Smith |
| 2003/0229410 A1 | 12/2003 | Smith |
| 2003/0229412 A1 | 12/2003 | White |
| 2003/0229868 A1 | 12/2003 | White |
| 2003/0229875 A1 | 12/2003 | Smith |
| 2003/0229880 A1 | 12/2003 | White |
| 2003/0229881 A1 | 12/2003 | White |
| 2003/0237064 A1 | 12/2003 | White et al. |
| 2004/0030430 A1 | 2/2004 | Matsuoka |
| 2004/0032908 A1 | 2/2004 | Hagai et al. |
| 2004/0052411 A1 | 3/2004 | Qian et al. |
| 2004/0057611 A1 | 3/2004 | Lee |
| 2004/0091142 A1 | 5/2004 | Peterson et al. |
| 2004/0098216 A1 | 5/2004 | Ye et al. |
| 2004/0102934 A1 | 5/2004 | Chang |
| 2004/0107412 A1 | 6/2004 | Pack et al. |
| 2004/0119036 A1 | 6/2004 | Ye et al. |
| 2004/0120569 A1 | 6/2004 | Hung et al. |
| 2004/0133369 A1 | 7/2004 | Pack et al. |
| 2004/0174506 A1 | 9/2004 | Smith |
| 2004/0223639 A1 | 11/2004 | Sato |
| 2004/0228515 A1 | 11/2004 | Okabe et al. |
| 2004/0243320 A1 | 12/2004 | Chang et al. |
| 2005/0004774 A1 | 1/2005 | Volk et al. |
| 2005/0008218 A1 | 1/2005 | O'Dell et al. |
| 2005/0010890 A1 | 1/2005 | Nehmadi et al. |
| 2005/0062962 A1 | 3/2005 | Fairley |
| 2005/0117796 A1 | 6/2005 | Matsui |
| 2005/0132306 A1* | 6/2005 | Smith et al. .................... 716/1 |
| 2005/0141764 A1 | 6/2005 | Tohyama et al. |
| 2005/0166174 A1 | 7/2005 | Ye et al. |
| 2005/0184252 A1* | 8/2005 | Ogawa et al. ............ 250/492.3 |
| 2005/0190957 A1 | 9/2005 | Cai et al. |
| 2005/0198602 A1 | 9/2005 | Brankner |
| 2006/0000964 A1 | 1/2006 | Ye et al. |
| 2006/0048089 A1 | 3/2006 | Schwarzband |
| 2006/0051682 A1 | 3/2006 | Hess et al. |
| 2006/0062445 A1 | 3/2006 | Verma et al. |
| 2006/0082763 A1 | 4/2006 | Teh et al. |
| 2006/0159333 A1 | 7/2006 | Ishikawa |
| 2006/0161452 A1 | 7/2006 | Hess et al. |
| 2006/0193506 A1 | 8/2006 | Dorphan et al. |
| 2006/0193507 A1 | 8/2006 | Sali et al. |
| 2006/0236294 A1 | 10/2006 | Saidin |
| 2006/0236297 A1 | 10/2006 | Melvin et al. |
| 2006/0265145 A1 | 11/2006 | Huet et al. |
| 2006/0266243 A1* | 11/2006 | Percin et al. ................. 101/484 |
| 2006/0269120 A1 | 11/2006 | Nehmadi et al. |
| 2006/0273242 A1 | 12/2006 | Hunsche et al. |
| 2006/0273266 A1 | 12/2006 | Preil et al. |
| 2006/0291714 A1 | 12/2006 | Wu et al. |

| | | | |
|---|---|---|---|
| 2006/0292463 | A1 | 12/2006 | Best et al. |
| 2007/0002322 | A1 | 1/2007 | Borodovsky et al. |
| 2007/0019171 | A1 | 1/2007 | Smith |
| 2007/0031745 | A1 | 2/2007 | Ye et al. |
| 2007/0032896 | A1 | 2/2007 | Ye et al. |
| 2007/0035322 | A1 | 2/2007 | Kang et al. |
| 2007/0035712 | A1 | 2/2007 | Gassner et al. |
| 2007/0035728 | A1 | 2/2007 | Kekare et al. |
| 2007/0052963 | A1 | 3/2007 | Orbon |
| 2007/0064995 | A1 | 3/2007 | Oaki et al. |
| 2007/0156379 | A1 | 7/2007 | Kulkarni et al. |
| 2007/0230770 | A1 | 10/2007 | Kulkarni et al. |
| 2007/0248257 | A1 | 10/2007 | Bruce et al. |
| 2007/0288219 | A1 | 12/2007 | Zafar et al. |
| 2008/0049994 | A1 | 2/2008 | Rognin et al. |
| 2008/0304056 | A1 | 12/2008 | Alles et al. |
| 2009/0016595 | A1 | 1/2009 | Peterson et al. |
| 2009/0024967 | A1 | 1/2009 | Su et al. |
| 2009/0041332 | A1 | 2/2009 | Bhaskar et al. |
| 2009/0055783 | A1 | 2/2009 | Florence et al. |

FOREIGN PATENT DOCUMENTS

| | | |
|---|---|---|
| EP | 0370322 | 5/1990 |
| EP | 1061358 | 12/2000 |
| EP | 1061571 | 12/2000 |
| EP | 1065567 | 1/2001 |
| EP | 1066925 | 1/2001 |
| EP | 1069609 | 1/2001 |
| EP | 1093017 | 4/2001 |
| EP | 1480034 | 11/2004 |
| EP | 1696270 | 8/2006 |
| JP | 2002-071575 | 3/2002 |
| KR | 1020030055848 | 7/2003 |
| WO | WO 98/57358 | 12/1998 |
| WO | WO 99/22310 | 5/1999 |
| WO | WO 99/25004 | 5/1999 |
| WO | WO 99/38002 | 7/1999 |
| WO | WO 99/41434 | 8/1999 |
| WO | WO 99/59200 | 11/1999 |
| WO | WO 00/03234 | 1/2000 |
| WO | WO 00/36525 | 6/2000 |
| WO | WO 00/55799 | 9/2000 |
| WO | WO 00/68884 | 11/2000 |
| WO | WO 00/70332 | 11/2000 |
| WO | WO 01/09566 | 2/2001 |
| WO | WO 01/40145 | 6/2001 |
| WO | WO 03/104921 | 12/2003 |
| WO | WO 2004/027684 | 4/2004 |
| WO | 2006039584 | 4/2006 |
| WO | WO 2006/063268 | 6/2006 |

OTHER PUBLICATIONS

Budd et al., "A New Mask Evaluation Tool, the Microlithography Simulation Microscope Aerial Image Measurement System," SPIE vol. 2197, 1994, pp. 530-540.

Cai et al., "Enhanced Dispositioning of Reticle Defects Using the Virtual Stepper With Automoated Defect Severity Scoring," Proceedings of the SPIE, vol. 4409, Jan. 2001, pp. 467-478.

Comizzoli, "Uses of Corono Discharges in the Semiconfuctor Industry," J. Electrochem. Soc., 1987, pp. 424-429.

Contactless Electrical Equivalent Oxide Thickness Measurement, IBM Technical Disclosure Bulletin, vol. 29, No. 10, 1987, pp. 4622-4623.

Contactless Photovoltage vs. Bias Method for Determining Flat-Band Voltage, IBM Technical Disclosure Bulletin, vol, 32, vol. 9A, 1990, pp. 14-17.

Cosway et al., "Manufacturing Implementation of Corona Oxide Silicon (COS) Systems for Diffusion Furnace Contamination Monitoring," 1997 IEEE/SEMI Advanced Semiconductor Manufacturing Conference, pp. 98-102.

Diebold et al., "Characterization and production metrology of thin transistor gate oxide films," Materials Science in Semiconductor Processing 2, 1999, pp. 103-147.

Garcia et al., "New Die to Database Inspection Algorithm for Inspection of 90-nm Node Reticles," Proceedings of SPIE, vol. 5130, 2003, pp. 364-374.

Granik et al., "Sub-resolution process windows and yield estimation technique based on detailed full-chip CD simulation," Mentor Graphics, Sep. 2000, 5 pages.

Hess et al., "A Novel Approach: High Resolution Inspection with Wafer Plane Defect Detection," Proceedings of SPIE—International Society for Optical Engineering; Photomask and Next-Generation Lithography Mask Technology 2008, vol. 7028, 2008.

Huang et al., "Process Window Impact of Progressive Mask Defects, Its Inspection and Disposition Techniques (go/no-go criteria) Via a Lithographic Detector," Proceedings of SPIE—The International Society for Optical Engineering; 25th Annual Bacus Symposium on Photomask Technology 2005, vol. 5992, No. 1, 2005, p. 6.

Hung et al., Metrology Study of Sub 20 Angstrom oxynitride by Corona-Oxide-Silicon (COS) and Conventional C-V Approaches, 2002, Mat. Res. Soc. Symp. Proc., vol. 716, pp. 119-124.

International Search Report and Written Opinion for PCT Appln. No. PCT/US06/61112 dated Sep. 25, 2008.

International Search Report and Written Opinion for PCT Appln. No. PCT/US06/61113 dated Jul. 16, 2008.

International Search Report and Written Opinion for PCT Appln. No. PCT/US08/050397 dated Jul. 11, 2008.

International Search Report and Written Opinion for PCT/US2008/062873 mailed Aug. 12, 2008.

International Search Report for PCT/US2008/62875 mailed Sep. 10, 2008.

International Search Report and Written Opinion for PCT Appln. No. PCT/US2008/063008 dated Aug. 18, 2008.

International Search Report for PCT/US2003/21907 mailed Jun. 7, 2004.

International Search Report for PCT/US2004/040733 mailed Dec. 23, 2005.

Karklin et al., "Automatic Defect Severity Scoring for 193 nm Reticle Defect Inspection," Proceedings of SPIE—The International Society for Optical Engineering, 2001, vol. 4346, No. 2, pp. 898-906.

Lu et al., "Application of Simulation Based Defect Printability Analysis for Mask Qualification Control," Proceedings of SPIE, vol. 5038, 2003, pp. 33-40.

Martino et al., "Application of the Aerial Image Measurement System (AIMS(TM)) to the Analysis of Binary Mask Imaging and Resolution Enhancement Techniques," SPIE vol. 2197, 1994, pp. 573-584.

Miller, "A New Approach for Measuring Oxide Thickness," Semiconductor International, Jul. 1995, pp. 147-148.

Nagpal et al., "Wafer Plane Inspection for Advanced Reticle Defects," Proceedings of SPIE—The International Society for Optical Engineering; Photomask and Next-Generation Lithography Mask Technology. vol. 7028, 2008.

Numerical Recipes in C. The Art of Scientific Computing, 2nd Ed.,© Cambridge University Press 1988, 1992, p. 683.

Otsu, "A Threshold Selection Method from Gray-Level Histograms," IEEE Transactions on Systems, Man, and Cybernetics, vol. SMC-9, No. 1, Jan. 1979, pp. 62-66.

Pang et al,, "Simulation-based Defect Printability Analysis on Alternating Phase Shifting Masks for 193 nm Lithography," Proceedings of SPIE, vol. 4889, 2002, pp. 947-954.

Pettibone et al., "Wafer Printability Simulation Accuracy Based on UV Optical Inspection Images of Reticle Defects," Proceedings of SPIE—The International Society for Optical Engineering 1999 Society of Photo-Optical Instrumentation Engineers, vol. 3677, No. II, 1999, pp. 711-720.

Phan et al., "Comparison of Binary Mask Defect Printability Analysis Using Virtual Stepper System and Aerial Image Microscope System," Proceedings of SPIE—The International Society for Optical Engineering 1999 Society of Photo-Optical Instrumentation Engineers, vol. 3873, 1999, pp. 681-692.

Sahouria et al., "Full-chip Process Simulation for Silicon DRC," Mentor Graphics, Mar. 2000, 6 pages.

Schroder et al., Corono-Oxide-Semiconductor Device Characterization, 1998, Solid-State Electronics, vol. 42, No. 4, pp. 505-512.

Schroder, "Surface voltage and surface photovoltage: history, theory and applications," Measurement Science and Technology, vol. 12, 2001, pp. R16-31.

Schroder, Contactless Surface Charge Semiconductor Characterization, Apr. 2002, Materials Science and Engineering B, vol. 91-92, pp. 196-228.

Schurz et al., "Simulation Study of Reticle Enhancement Technology Applications for 157 nm Lithography," SPIE vol. 4562, 2002, pp. 902-913.

U.S. Appl. No. 10/677,445 (Horner et al.) entitled Methods for Non-Contacting Differential Voltage Measurements filed on Oct. 2, 2003.

U.S. Appl. No. 11/139,151 (Volk et al.) entitled Methods and Systems for Detecting Changes in Reticle Defectivity Over Time filed on May 27, 2005.

U.S. Appl. No. 60/418,887 (Su et al.) entitled Methods and Systems for Inspecting Reticles Using Aerial Imaging and Die-To-Database Detection filed on Oct. 15, 2002.

U.S. Appl. No. 60/419,028 (Stokowski et al.) entitled Methods and Systems for Inspecting Reticles Using Aerial Imaging At Off-Stepper Wavelengths filed on Oct. 15, 2002.

U.S. Appl. No. 60/485,233 (Peterson et al.) entitled Qualifying Patterns, Patterning Processes, or Patterning Apparatus in the Fabrication of Microlithographic Patterns filed on Jul. 7, 2003.

U.S. Appl. No. 60/526,881 (Hess et al.) entitled Designer Intent filed on Dec. 4, 2003.

U.S. Appl. No. 60/681,095 (Nehmadi et al.) entitled Methods in Mask and Process Qualification filed on May 13, 2005.

U.S. Appl. No. 60/684,360 (Nehmadi et al.) entitled Design-Based Inspection filed on May 24, 2005.

Verkuil et al., "A Contactless Alternative to MOS Charge Measurements by Means of a Corona-Oxide-Semiconductor (COS) Technique," Electrochem. Soc. Extended Abstracts, 1988, vol. 88-1, No. 169, pp. 261-262.

Verkuil, "Rapid Contactless Method for Measuring Fixed Oxide Charge ASsociated with Silicon Processing," IBM Technical Disclousre Bulletin, vol. 24, No. 6, 1981, pp. 3048-3051.

Volk et al. "Investigation of Reticle Defect Formation at DUV Lithography," 2002, BACUS Symposium on Photomask Technology.

Volk et al. "Investigation of Reticle Defect Formation at DUV Lithography," 2003, IEEE/SEMI Advanced Manufacturing Conference, pp. 29-35.

Weinberg, "Tunneling of Electrons from Si into Thermally Grown SiO2," Solid-State Electronics, 1977, vol. 20, pp. 11-18.

Weinzierl et al., "Non-Contact Corona-Based Process Control Measurements: Where We've Been, Where We're Headed," Electrochemical Society Proceedings, Oct. 1999, vol. 99-16, pp. 342-350.

Yan et al., "Printability of Pellicle Defects in DUV 0.5 um Lithography," SPIE vol. 1604, 1991, pp. 106-117.

International Search Report for PCT/US2008/070647 mailed Dec. 16, 2008.

International Search Report and Written Opinion for PCT/US2008/073706 mailed Jan. 29, 2009.

International Search Report and Written Opinion for PCT/US2008/072636 mailed Jan. 29, 2009.

U.S. Appl. No. 60/418,994, filed Oct. 2002, Stokowski.
U.S. Appl. No. 60/451,707, filed Mar. 2003, Howard.
U.S. Appl. No. 60/609,670, filed Sep. 2004, Preil.
U.S. Appl. No. 60/738,290, filed Nov. 2005, Kulkarni.
U.S. Appl. No. 60/772,418, filed Feb. 2006, Kirk et al.
U.S. Appl. No. 10/679,617, filed Oct. 2003, Stokowski.
U.S. Appl. No. 10/778,752, filed Feb. 2004, Mack.
U.S. Appl. No. 10/793,599, filed Mar. 2004, Howard.
U.S. Appl. No. 11/154,310, filed Jun. 2005, Verma et al.
U.S. Appl. No. 11/300,172, filed Dec. 2005, Lin.
U.S. Appl. No. 11/673,150, filed Feb. 2007, Kirk et al.
U.S. Appl. No. 11/830,485, filed Jul. 2007, Kulkarni et al.
U.S. Appl. No. 11/837,208, filed Aug. 2007, Park.
U.S. Appl. No. 11/950,961, filed Dec. 2007, Fouquet et al.
U.S. Appl. No. 11/970,294, filed Jan. 2008, Park et al.
U.S. Appl. No. 12/102,343, filed Apr. 2008, Chen et al.

Dirksen et al., "Impact of high order aberrations on the performance of the aberration monitor," Proc. Of SPIE vol. 4000, Mar. 2000, pp. 9-17.

Dirksen et al., "Novel aberration monitor for optical lithography," Proc. Of SPIE vol. 3679, Jul. 1999, pp. 77-86.

Lo et al., "Identifying Process Window Marginalities of Reticle Designs for 0.15/0.13 μm Technologies." Proceedings of SPIE vol. 5130, 2003, pp. 829-837.

Lorusso et al. "Advanced DFM Applns. Using design-based metrology on CDSEM," SPIE vol. 6152, Mar. 27, 2006.

Mack, "Lithographic Simulation: A Review," Proceedings of SPIE vol. 4440, 2001, pp. 59-72.

Svidenko et al. "Dynamic Defect-Limited Yield Prediction by Criticality Factor," ISSM Paper: YE-O-157, 2007.

Volk et al., "Investigation of Smart Inspection of Critical Layer Reticles using Additional Designer Data to Determine Defect Significance," Proceedings of SPIE vol. 5256, 2003, pp. 489-499.

Allan et al., "Critical Area Extraction for Soft Fault Estimation," IEEE Transactions on Semiconductor Manufacturing, vol. 11, No. 1, Feb. 1998.

Svidenko et al, "Dynamic Defect-Limited Yield Prediction by Criticality Factor," ISSM Paper YE-O-157, 2007.

International Search Report & Written Opinion, PCT/US2007/088129, mailed Jul. 21, 2009.

International Search Report & Written Opinion, PCT/US2008/066328, mailed Oct. 1, 2009.

O'Gorman et al., "Subpixel Registration Using a Concentric Ring Fiducial," Proceedings of the International Conference on Pattern Recognition, vol. ii, Jun. 16, 1990, pp. 249-253.

* cited by examiner

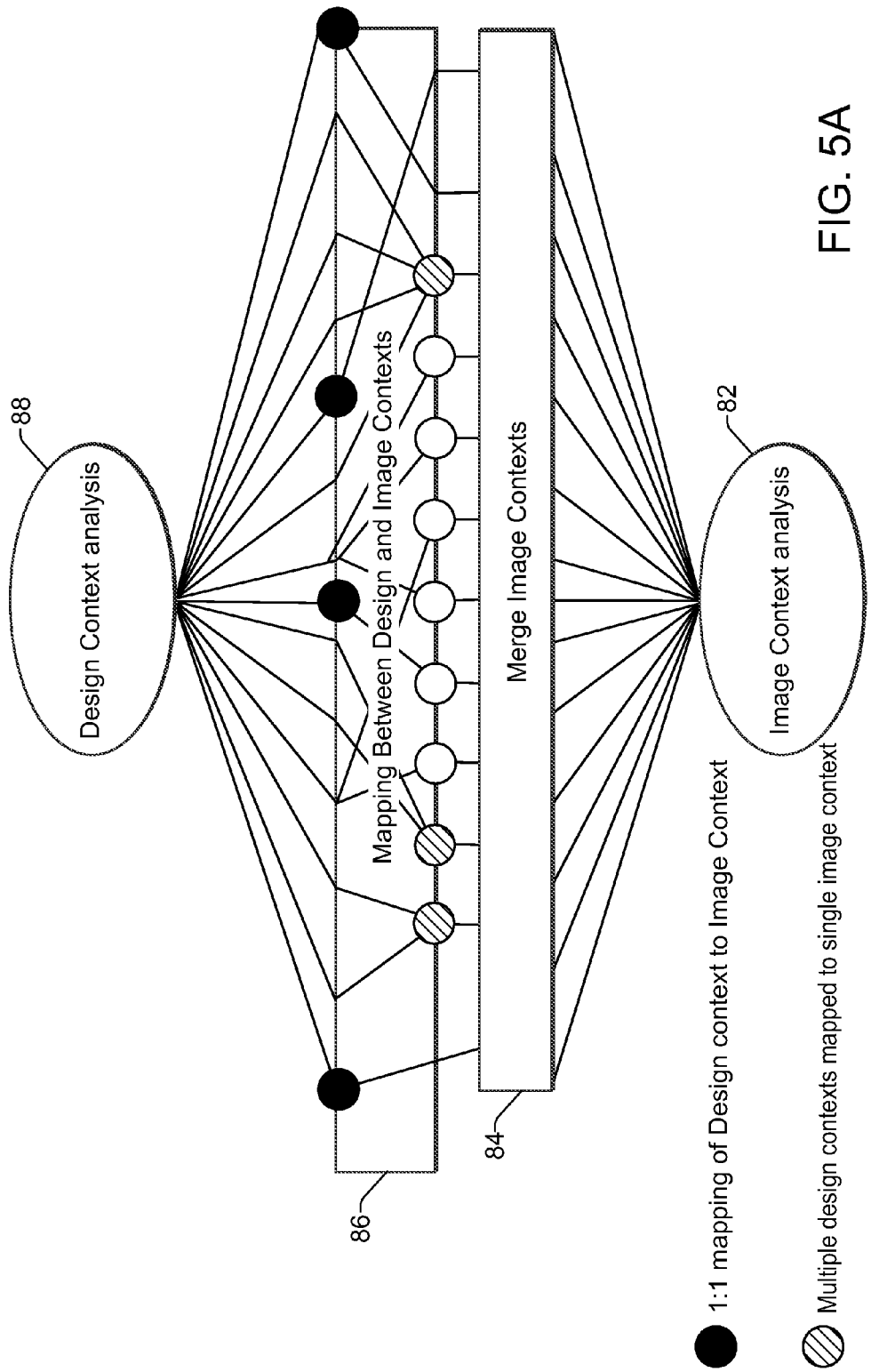

Offline training of Image-to-Design Context Mapping

SYSTEMS AND METHODS FOR CREATING INSPECTION RECIPES

PRIORITY CLAIM

This application claims priority to U.S. Provisional Application No. 60/870,724 entitled "Methods and Systems for Creating Inspection Recipes Using Design Data," filed Dec. 19, 2006, which is incorporated by reference as if fully set forth herein.

BACKGROUND OF THE INVENTION

1. Field of the Invention

The present invention generally relates to systems and methods for creating inspection recipes. Certain embodiments relate to a computer-implemented method for creating an inspection recipe based on a design different from that for which the inspection recipe is being created.

2. Description of the Related Art

The following description and examples are not admitted to be prior art by virtue of their inclusion in this section.

An integrated circuit (IC) design may be developed using a method or system such as electronic design automation (EDA), computer aided design (CAD), and other IC design software. Such methods and systems may be used to generate a circuit pattern database from the IC design. The circuit pattern database includes data representing a plurality of layouts for various layers of the IC. Data in the circuit pattern database may be used to determine layouts for a plurality of reticles. A layout of a reticle generally includes a plurality of polygons that define features in a pattern on the reticle. Each reticle is used to fabricate one of the various layers of the IC. The layers of the IC may include, for example, a junction pattern in a semiconductor substrate, a gate dielectric pattern, a gate electrode pattern, a contact pattern in an interlevel dielectric, and an interconnect pattern on a metallization layer.

The term "design data" as used herein generally refers to the physical design (layout) of an IC and data derived from the physical design through complex simulation or simple geometric and Boolean operations.

A semiconductor device design is verified by different procedures before production of ICs. For example, the semiconductor device design is checked by software simulation to verify that all features will be printed correctly after lithography in manufacturing. Such checking commonly includes steps such as design rule checking (DRC), optical rule checking (ORC), and more sophisticated software-based verification approaches that include process simulation calibrated to a specific fab and process. The output of the physical design verification steps can be used to identify a potentially large number of critical points, sometimes referred to as "hot spots," in the design.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on wafers to promote higher yield in the manufacturing process and thus higher profits. Inspection has always been an important part of fabricating semiconductor devices such as ICs. However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary since even relatively small defects may cause unwanted aberrations in the semiconductor devices.

As design rules shrink, however, semiconductor manufacturing processes may be operating closer to the limitations on the performance capability of the processes. In addition, smaller defects can have an impact on the electrical parameters of the device as the design rules shrink, which drives more sensitive inspections. Therefore, as design rules shrink, the population of potentially yield relevant defects detected by inspection grows dramatically, and the population of nuisance defects detected by inspection also increases dramatically. Therefore, more and more defects may be detected on the wafers, and correcting the processes to eliminate all of the defects may be difficult and expensive.

Some methods involve aligning inspection care areas (e.g., the areas of the device pattern formed on the wafer in which inspection will be performed) to the physical location of the pattern printed on the wafer. However, currently, the care areas can be aligned to the pattern printed on the wafer with an accuracy of no better than about 2 µm due to system errors and imperfections. For instance, some bright field (BF) inspection systems have coordinate accuracies of about +/−1 µm. In addition, the inspection care areas in currently used methods are relatively large and include many noncritical features as well as desired critical features. In trying to maximize the sensitivity of the inspection system to capture subtle spatially systematic "design-for-manufacturability" (DFM) defects resulting from design and process interdependencies, the system may be overwhelmed by millions of events in non-critical areas such as CMP fill regions. Detecting such nuisance defects is disadvantageous for a number of reasons. For example, these nuisance events need to be filtered out of the inspection results by post-processing of the inspection data. In addition, nuisance event detection limits the ultimate achievable sensitivity of the inspection system for DFM applications. A high rate of nuisance defect data may also overload the run time data processing capacity of the inspection system thereby reducing throughput and/or causing the loss of data.

Many current methods of generating an inspection recipe make no use of the design data associated with a device (chip). Recipe generation includes a trial-and-error iterative approach in which the wafer is scanned in different imaging modes and for each such scan, the detection thresholds are varied and defects manually reviewed (usually on a scanning electron microscope (SEM) review station). The die is segmented into regions in a relatively broad sense (e.g., array versus logic), and the thresholds are modified (iteratively) until defects of interest are caught without detecting too many nuisance defects.

The existing methods for inspection recipe setup have a number of disadvantages. For instance, no use is made of design context in these methods. Thus, the partitioning of the die into various regions that are to be inspected with different sensitivities is performed in an ad hoc manner and can vary from operator to operator. In addition, the die partitioning process and threshold selection process is time consuming and must be repeated for each new device. There is no capability of transferring information learned from one device to the next. Furthermore, if the inspection system has many imaging modes, the operator must try each mode (or some sample set of the modes from prior experience) and use a trial-and-error method, varying detection thresholds for each mode, reviewing defects, and then deciding on the best mode to use for subsequent inspections of that device and layer.

Accordingly, it would be advantageous to develop methods and systems for creating inspection recipes that do not have one or more of the disadvantages of the methods and systems described above.

SUMMARY OF THE INVENTION

The following description of various embodiments of methods, carrier media, and systems is not to be construed in any way as limiting the subject matter of the appended claims.

One embodiment relates to a computer-implemented method for creating an inspection recipe. The method includes acquiring a first design and one or more characteristics (such as image characteristics) of output of an inspection system for a wafer on which the first design is printed using a manufacturing process, and creating a mapping between design attributes and certain image characteristics. The method also includes automatically creating an inspection recipe for a second design (that is different from the first design) using the mapping learned from the first design and the characteristics of its output. The inspection recipe will be used for inspecting wafers printed using the second design and using the same manufacturing process as was used for the first design.

In one embodiment, creating the inspection recipe includes creating the inspection recipe using the first design, the one or more characteristics of the output, and the second design. In another embodiment, creating the inspection recipe includes creating the inspection recipe using the first design, the one or more characteristics of the output acquired for the wafer on which the first design is printed, and one or more characteristics of output of the inspection system for a wafer on which the second design is printed. In an additional embodiment, creating the inspection recipe includes creating a classifier that maps different portions of the first design and the one or more characteristics of the output acquired for the wafer on which the first design is printed, acquiring output of the inspection system for a wafer on which the second design is printed, determining one or more characteristics of the output acquired for the wafer on which the second design is printed, and assigning a context identity to different portions of the second design using the one or more characteristics of the output acquired for the wafer on which the second design is printed and the classifier constructed using the first design. In one such embodiment, the results of classification of contexts on the second design are stored in a context map and used for subsequent inspections of that design without requiring use of the classifier on subsequent wafers inspected.

In one embodiment, creating the inspection recipe includes creating a context map for the second design using the first design and the one or more characteristics of the output. In another embodiment, creating the inspection recipe includes creating a context map for the second design using the first design and the one or more characteristics of the output and storing the context map in the inspection recipe such that inspection is performed using the context map.

In some embodiments, creating the inspection recipe includes creating a context map for the second design using the first design and the one or more characteristics of the output, and the method includes using the context map to create a defect review recipe for the second design. In an additional embodiment, creating the inspection recipe includes creating a context map by segmenting a die into different region types based on hierarchy of cells, structures, or some combination thereof in the second design.

In one embodiment, the one or more characteristics of the output include one or more characteristics of noise in the output. In another embodiment, the method includes determining multi-die statistics for different context types in the first design using the one or more characteristics of the output and splitting at least one of the different context types into context sub-types based on appearance and noise levels of the output. In another embodiment, the method includes determining multi-die statistics for different context types in the first design using the one or more characteristics of the output and merging different context types that have similar one or more characteristics of the output and similar noise characteristics. In some such embodiments, creating the inspection recipe includes creating the inspection recipe using the first design, the one or more characteristics of the output, and the context sub-types and/or merged contexts as described above.

In some embodiments, creating the inspection recipe includes creating a context map for the second design using the first design and the one or more characteristics of the output and creating the inspection recipe using the context map, and the context map includes different context types in the second design, using the context types and sub-types learned from the first design, as described above.

In one embodiment, creating the inspection recipe includes creating a context map for the second design using the first design and the one or more characteristics of the output and creating the inspection recipe using the context map such that different sensitivity thresholds for defect detection are applied to output acquired for at least two different contexts in the second design. In another embodiment, creating the inspection recipe includes creating a context map for the second design using the first design and the one or more characteristics of the output and creating the inspection recipe using the context map such that defects detected by inspecting the wafers on which the second design is printed are classified based on the context map. In an additional embodiment, creating the inspection recipe includes creating a context map for the second design using the first design and the one or more characteristics of the output and creating the inspection recipe using the context map such that defects detected by inspecting the wafers on which the second design is printed are grouped based on the context map. In a further embodiment, creating the inspection recipe includes creating a context map for the second design using the first design and the one or more characteristics of the output and creating the inspection recipe using the context map such that systematic defect mechanisms in the second design are detected using results of inspecting the wafers on which the second design is printed and the context map.

In one embodiment, creating the inspection recipe includes selecting an optics mode for the inspection recipe using a scoring function based on the first design, the one or more characteristics of the output, and defect detectability in different optics modes for different design contexts present in the first design. In an additional embodiment, the acquiring step includes acquiring the first design and the one or more characteristics of the output from a design context-based repository in which different design contexts and the corresponding characteristic(s) of the output are stored. In a further embodiment, the first and second designs are designs for different devices.

In one embodiment, the inspection system (the output of which is acquired for the wafer on which the first design is printed) is the inspection system for which an inspection recipe is being created. In another embodiment, the output of the inspection system for the wafer on which the first design is printed is acquired using an optics mode of the inspection system different than an optics mode of the inspection system for which the recipe is being created. In an additional embodiment, the inspection system, the output of which is acquired for the wafer on which the first design is printed, has a different platform than an inspection system for which the recipe is being created.

Each of the steps of each of the embodiments of the method described above may be further performed as described herein. In addition, each of the embodiments of the computer-implemented method described above may include any other step(s) of any other method(s) described herein. Furthermore, each of the embodiments of the computer-implemented method described above may be performed by any of the systems described herein.

Another embodiment relates to a carrier medium that includes program instructions executable on a computer system for performing a computer-implemented method for creating an inspection recipe. The method includes acquiring a first design and one or more characteristics of output of an inspection system for a wafer on which the first design is printed using a manufacturing process. The method also includes creating an inspection recipe for a second design using the first design and the one or more characteristics of the output acquired for the wafer on which the first design is printed. The first and second designs are different. The inspection recipe will be used for inspecting wafers after the second design is printed on the wafers using the manufacturing process.

Each of the steps of the computer-implemented method described above may be further performed as described herein. In addition, the computer-implemented method may include any other step(s) of any other method(s) described herein. The carrier medium may be further configured as described herein.

An additional embodiment relates to a system configured to create an inspection recipe. The system includes an inspection system configured to acquire output for a wafer on which a first design is printed using a manufacturing process. The system also includes a computer system configured to create an inspection recipe for a second design using the first design and one or more characteristics of the output acquired for the wafer on which the first design is printed. The first and second designs are different. The inspection recipe will be used for inspecting wafers after the second design is printed on the wafers using the manufacturing process. The system may be further configured as described herein.

Still another embodiment relates to a method for using a design-based context data structure or "repository" to generate a context map for optimizing the sensitivity of an inspection or the accuracy of defect classification including one or more of the following data sources, optimization constructs, or operations: design layout; design hierarchy; image data; noise maps; yield criticality; historical inspection results; cost function for optics mode selection; mapping between data sources; partitioning methods for each data source; image characteristic signatures; care area component generation; care area component scale and register; signal-to-noise ratio calibration with historical inspection results; and context map compression. Using the design-based context data structure or "repository" to generate the context map may be performed as described further herein. In addition, this method may include any other step(s) described herein. Furthermore, this method may be performed by any of the systems described herein.

BRIEF DESCRIPTION OF THE DRAWINGS

Further advantages of the present invention may become apparent to those skilled in the art with the benefit of the following detailed description of the preferred embodiments and upon reference to the accompanying drawings in which:

FIGS. 5 and 5A are flow charts illustrating one embodiment of mapping design context to image contexts;

Figure 1:
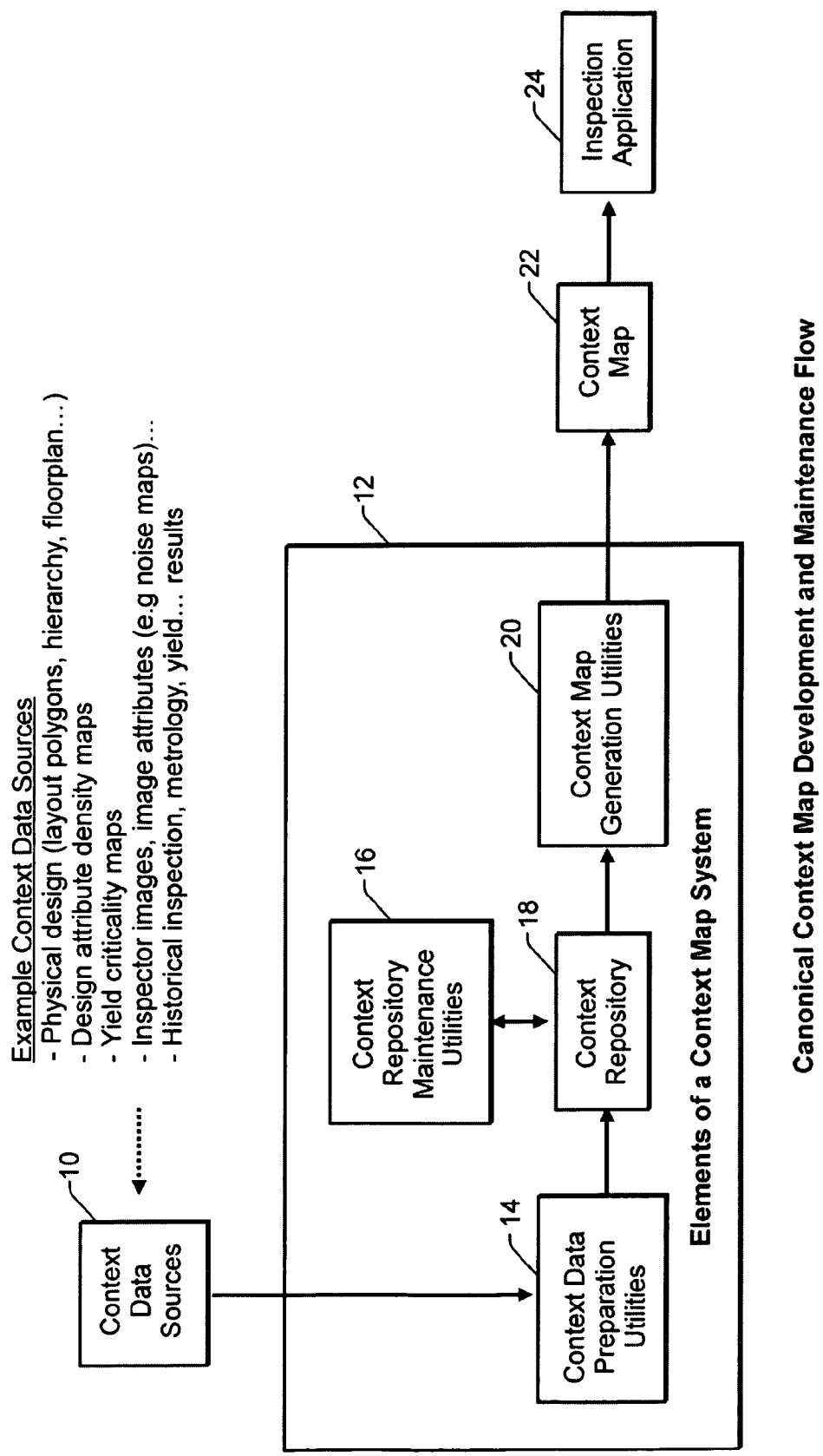
FIG. 1 is a flow chart illustrating one embodiment of a canonical context map development and maintenance flow.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

As used herein, the term "specimen" generally refers to a wafer or any other specimen for which an inspection recipe may be created. Although the terms "specimen" and "wafer" are used interchangeably herein, it is to be understood that embodiments described herein with respect to a wafer may be configured and/or used to create an inspection recipe for any other specimen (e.g., a reticle, mask, or photomask).

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

One or more layers may be formed upon a wafer. Many different types of such layers are known in the art, and the term wafer as used herein is intended to encompass a wafer on which all types of such layers may be formed. One or more layers formed on a wafer may be patterned. For example, a wafer may include a plurality of dies, each having repeatable patterned features. Formation and processing of such layers of material may ultimately result in completed semiconductor devices. As such, a wafer may include a substrate on which not all layers of a complete semiconductor device have been formed or a substrate on which all layers of a complete semiconductor device have been formed.

The wafer may further include at least a portion of an integrated circuit (IC), a thin-film head die, a micro-electromechanical system (MEMS) device, flat panel displays, magnetic heads, magnetic and optical storage media, other components that may include photonics and optoelectronic devices such as lasers, waveguides and other passive components processed on wafers, print heads, and bio-chip devices processed on wafers.

The term "design" as used herein generally refers to the physical design (layout) of an IC and data derived from the physical design through complex simulation or simple geometric and Boolean operations. The design may include not only layout information, but electrical and material design information as well. Basically, the design may include any design information that is used in the creation of a "device." In addition, an image of a reticle acquired by a reticle inspection system and/or derivatives thereof can be used as a "proxy" or "proxies" for the design. Such a reticle image or a derivative thereof can serve as a substitute for the design in any embodiments described herein. The design may include any other design data or design data proxies described in commonly owned U.S. patent application Ser. No. 11/561,735 by Kulkarni et al. and Ser. No. 11/561,659 by Zafar et al., both of which were filed on Nov. 20, 2006 and both of which are incorporated by reference as if fully set forth herein.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals.

In general, the embodiments described herein are configured for creating an inspection recipe. For example, the embodiments are configured to create an inspection recipe using design data. The embodiments described herein are also configured for using both image and design information to create an inspection recipe. In some embodiments, the methods described herein include using both image and design information to create a context map for inspection and/or review. For example, the context map created using both image and design information may be used to create the inspection recipe. The inspection recipe may be a recipe for wafer inspection. The inspection recipe may also be a recipe for any suitable inspection process known in the art. The term "recipe" can be generally defined as a set of instructions that can be used by a system such as an inspection system to perform a process such as an inspection process.

One embodiment relates to a computer-implemented method for creating an inspection recipe. The method includes acquiring a first design and one or more characteristics of output of an inspection system for a wafer on which the first design is printed using a manufacturing process. Acquiring the first design may be performed in any suitable manner. For example, as described further herein, the first design may be acquired from a design-based context data structure or "repository" or another storage medium in which the first design is stored. The first design and other designs described herein may be acquired in any suitable format and may or may not be converted to a different format prior to using the designs in the embodiments described herein.

Acquiring the one or more characteristics of the output of the inspection system may include acquiring the one or more characteristics from a storage medium in which the characteristic(s) are stored. For example, the one or more characteristics of the output may be determined by another method or system (e.g., the inspection system or a computer system coupled thereto) and stored in a storage medium (e.g., a storage medium included in the inspection system or a fab database coupled to the inspection system by a transmission medium, which may include "wired" and/or "wireless" portions). In this manner, acquiring the one or more characteristics of the output may not include determining the one or more characteristics of the output. However, in other embodiments, the computer-implemented method includes determining the one or more characteristics of the output to thereby acquire the one or more characteristics of the output. Determining the one or more characteristics of the output may include acquiring the output, which may be acquired from a storage medium as described above or by performing an inspection or scan of the wafer using the inspection system. In this manner, the computer-implemented method may or may not include inspecting or scanning the wafer on which the first design is printed. The first design may be printed on the wafer using any suitable manufacturing process (e.g., lithography and/or etch).

The output of the inspection system for the wafer on which the first design is printed may include any suitable output and may vary depending on the configuration of the inspection system. For example, the output may include signals, data, images, or image data responsive to light scattered from the wafer (e.g., in the case of dark field (DL) inspection systems) or images or image data responsive to light reflected from the wafer (e.g., in the case of bright field (BF) inspection systems). The inspection system may be a commercially available inspection system such as the 28xx systems, which are commercially available from KLA-Tencor, San Jose, Calif.

In one embodiment, the inspection system is the inspection system for which an inspection recipe is being created. In another embodiment, the output of the inspection system for the wafer on which the first design is printed is acquired using an optics mode of the inspection system different than an optics mode of the inspection system for which the recipe is being created. In this manner, the inspection system output used for any of the steps described herein involved in creating the inspection recipe (e.g., context map generation) may be from a different optics mode than that for which the recipe is being generated. For example, a first design and an image of a wafer (printed with the first design) acquired using one optics mode of an inspection system may be used to generate segmentation with a context map that is then used to generate a recipe (for wafers printed with a second design) for a different optics mode of the same inspection system. In addition, the optics mode of the inspection system may be different from that used for recipe setup (e.g., to generate the context map) in instances in which the optics mode for the inspection recipe for the second design is selected as described further herein. In an additional embodiment, the inspection system, the output of which is acquired for the wafer on which the first design is printed, has a different platform than an inspection system for which the recipe is being created. As such, the inspection system output used for any of the steps described herein involved in creating the inspection recipe (e.g., context map generation) may be from a different inspection system platform than that for which the inspection recipe is being created. Different inspection platforms may include, for example, an electron beam-based inspection system platform and an optical-based inspection system platform. For example, a first design and an e-beam image of a wafer (printed with the first design) may be used to generate segmentation with a context map that is then used to generate an inspection recipe (for wafers printed with a second design) for a DR or BF tool.

The computer-implemented method also includes creating an inspection recipe for a second design using the first design and the one or more characteristics of the output acquired for the wafer on which the first design is printed. The first and second designs are different, and the inspection recipe will be used for inspecting wafers after the second design is printed on the wafers using the manufacturing process. Creating the inspection recipe for the second design may be performed as described further herein.

In one embodiment, the first and second designs are designs for different devices. For example, the first design may be for a given device, and the second design may be for a different device. The first and second chips are different devices in that they do not have the same design although different portions of the design may be substantially the same, e.g. a given cell may be present in both but its location and connectivity to other parts of the layout may be different. In another embodiment, the one or more characteristics of the output include one or more characteristics of noise in the output acquired for the wafer on which the first design is printed. For example, in some embodiments, the method includes scanning device A with a known design layout to obtain its wafer "noise" map and generating an inspection recipe for a different device (say B) by analyzing its design and inferring its noise characteristics from what was observed for device A. Scanning device A may be performed using any one or more imaging or optical modes of the inspection system.

Creating the inspection recipe may include partitioning the layout of device B into regions and assigning different detection thresholds for the various regions. The partitions and thresholds for device B may be generated automatically from information obtained from a noise map for device A, the design for device A, and the design for device B. In this manner, as described further herein, when the design layout for a new device is available, the embodiments may be configured for wafer-less setup of inspection recipes using context-to-image characteristic mapping learned from one device/layer to automatically create a context map for the new device/layer manufactured using the same process. The term "wafer-less setup" generally refers to creation of an inspection recipe without requiring the use of a sample wafer containing the device for which the inspection recipe is being created.

In case the design data for device B under test (or for which an inspection recipe is to be created) is not available, the embodiments described herein may include learning the mapping (classifier training) between the image and the design context using data from device A, which may be performed as described further herein. In this manner, as described further herein, the method may include setup of inspection recipes, which may include creating a classifier that classifies an image (e.g., a patch image) into a design context identity (ID) by training the classifier on a know device (for which a design is available) and subsequently using this classifier on a new device (for which a design is not available) to create a context map for this new device.

In one embodiment, acquiring the first design and the one or more characteristics of the output includes acquiring the first design and the one or more characteristics from a design context-based repository in which the first design and the one or more characteristics of the output are stored. For example, the embodiments for recipe synthesis described herein may use a design-based context data structure or "repository" to derive robust yet sensitive recipes for new devices using a given manufacturing process. The repository may contain, for example, all design contexts likely to be encountered in the various devices being designed and the corresponding image and noise characteristics that were learned from scans of previous devices. The repository may have any suitable format, structure, and configuration.

Some embodiments include using a design-based context repository to generate a context map for optimizing the sensitivity of an inspection or the accuracy of defect classification including one or more of the following data sources, optimization constructs, or operations: design layout; cell hierarchy; image data; noise maps; yield criticality; historical inspection results; cost function for optics mode selection; mapping between data sources; partitioning methods for each data source; image characteristic signatures; care area (CA) component generation; CA component scale and register; signal-to-noise ratio (S/N) calibration with historical inspection results; and context map compression. Using the design-based context repository to generate the context map may be performed as described further herein.

In one embodiment, creating the inspection recipe includes creating a context map for the second design using the first design and the one or more characteristics of the output and creating the inspection recipe using the context map. For example, FIG. 1 illustrates one embodiment of canonical context map development and maintenance flow. As shown in FIG. 1, context data sources 10 may include a number of different context data sources. Such context data sources may include, for example, physical design (layout polygons, hierarchy, floorplan, etc.), design attribute density maps, yield criticality maps, images generated by an inspection system, image attributes (e.g., noise maps), results such as historical inspection results, metrology results, yield results, etc., or some combination thereof.

As shown in FIG. 1, the context data sources may be input to context map system 12. As shown in FIG. 1, the context map system may include elements such as context data preparation utilities 14, context repository maintenance utilities 16, context repository 18, and context map generation utilities 20. As shown in FIG. 1, the context data sources may be input to the context data preparation utilities. The context data preparation utilities may perform any suitable preparation steps on the context data sources. The context data preparation utilities may prepare the context data for storage in the context repository. The context repository maintenance utilities may perform any suitable maintenance functions on the context repository. The context map generation utilities may use the context repository as described herein to generate context map 22. The context map may be used in one or more inspection applications (e.g., inspection application 24) as described further herein.

In one embodiment, creating the inspection recipe includes creating a classifier that maps different portions of the first design and the one or more characteristics of the output acquired for the wafer on which the first design is printed. For example, the methodology for generating an inspection recipe may use the design-based context repository. In particular, the methodology for recipe synthesis described herein may advantageously use the concept of a design context-based repository to derive robust yet sensitive recipes for new devices using a given manufacturing process. The context-based repository may use a wafer noise map acquired during initial recipe creation coupled with design information about the chip layout.

The methodology may include two parts. In the first part, the process may be characterized by scanning a wafer (of a given device, for example, device A) and acquiring a wafer noise map for the wafer for different imaging or optical modes (e.g., O1, O2, . . . Om). The design data for device A may be analyzed to partition the die area into regions corresponding to different design context types. Then, a mapping of design context type to image characteristic signature is performed. Such mapping may be performed as described in the above-referenced patent applications by Kulkarni et al. and Zafar et al. The result of this mapping may be a context noise signature for each context and each imaging or optical mode.

In one such example, a computer aided design (CAD)-derived context map may be generated for device A. The die image may include 640 Giga pixels assuming 50 nm pixels and a 40 mm by 40 mm die. The die image may be separated into, for example, blocks of 32 pixels by 32 pixels. The number of blocks that are generated may include 640 million blocks. One or more features may be extracted for each block, and the pixel blocks may be classified (e.g., by natural grouping) into one of, for example, 1000 "contexts." A sample image patch of each context may be acquired. 1000 patch images may be stored in an about 1 Mbyte image file. A context map of the die may be created and may include 640 million entries, which may be compressible into 200 Mbytes. The image file and context map may be made available to and used by wafer inspection systems during recipe creation (e.g., creating sensitivity regions), for manual review, for inline automatic defect classification (iADC), as input to a scanning electron microscope (SEM) review sample generator, for KLARITY offline analysis, or some combination thereof. KLARITY is a commercially available product from KLA-Tencor. In addition, a context criticality map may be updated after every manual review process. This map may also be used to drive review sampling.

In this manner, a CAD-generated context map may be created and used for inspection, binning, and any other defect-related functions. For example, in one embodiment, creating the inspection recipe includes creating a context map for the second design using the first design and the one or more characteristics of the output, which may be performed as described herein, and the method includes using the context map to create a defect review recipe for the second design. Creating the defect review recipe for the second design may be performed in a manner similar to that described herein for creating the inspection recipe for the second design. The defect review recipe may be created for a commercially available defect review system such as the EDR-5xxx review SEM, which is commercially available from KLA-Tencor. Creating the defect review recipe for the second design may include selecting any one or more adjustable parameters of defect review.

Creating the inspection recipe may include generating "care areas" (CA) for the design. Generating CA from design may include converting design data to CA components. For example, key geometry can be defined using graphical data stream (GDS) data, CAD data, or other suitable data on an electronic design automation (EDA) tool. The defined key geometry can be used to identify all occurrences of this geometry in the die layout. In this manner, GDS data may be converted to CA components. In particular, the GDS data may be converted to a CA component based on the identified CA. The identified CA may be used to generate a CA GDS file, which may be performed using a standard EDA tool. In addition, a command line program may be used to convert a properly formatted CA GDS file to a CA component.

The CA GDS file may be generated based on single level hierarchy. In addition, creating the CA GDS file may include defining CA coordinates and using layer and sub-layer mapping to define CA attributes such as group ID and whether those areas are to be inspected or not. Furthermore, any design analysis can be applied to determining CA such as mask nuisance structures. Moreover, design analysis can be applied to determining CA to improve rule-based binning (RBB) performance with region IDs and/or to improve sensitivity to random and/or systematic defects. The embodiments described herein are advantageous since thousands (even millions) of CA can be created in a relatively short amount of time (e.g., a few minutes).

The key geometry may also be used to identify registration and scaling features of the CA. For example, the identified CA or the CA GDS file may be created, a "base" recipe written based on wafer layout information, and wafer data may be used to identify registration and scaling features. In addition, creating the CA may include performing registration and scaling of the CA using the registration and scaling features.

Scaling and registering the CA component may also be performed using wafer data. For example, CA coordinate registration and scale may include scaling and re-registration of CA components (after the components have been generated) to correct errors in CA generation, to refine coordinates for better accuracy, and to decouple creation of the CA component from the wafer layout. In addition, the registration and scaling of the CA component may be performed using input from a user. Such scaling and re-registration of the CA component may be performed by a registration and scale utility that is command line executable and that modifies the CA component and creates a backup copy of the original CA component.

CA coordinate registration and scale may include offset only, scaling by die size, scaling by a manual factor, or some combination thereof. For example, for offset only registration and scaling, the size of the CA component may not be changed while the position of the CA component within a grid may be shifted in one or two dimensions within the grid (e.g., shift all CA by x microns in x-direction, shift all CA by y microns in y-direction). In addition, the size of the grid (e.g., grid width and height) may not be changed in such registration and scaling. For die-based scaling only, coordinate registration and scaling may include changing the width and/or height of the grid in which the CA is located, and the size and position of the CA within the grid may be scaled accordingly. For such die-based scaling, the die size in the recipe may not be changed. For manual factor scaling only, the scale of the CA component may be altered in one or two dimensions, which may effectively change the coordinates of the CA in one or two dimensions. In addition, the size of the grid (e.g., grid width and height) may not be changed in such registration and scaling. For a combination of two or more of the above registration and scaling methods, a CA component may be scaled in one or two dimensions and may be shifted in one or two dimensions (e.g., change all CA sizes and locations by a factor of x in the x-direction, change all CA sizes and locations by a factor of y in the y-direction, scale and shift CA by the same factor required to make x-die pitch=new x-die pitch of x, and scale and shift CA by the same factor required to make y-die pitch=new y-die pitch of y). In such registration and scaling, the shift operation may be performed after scaling has been performed. In addition, the size of the grid (e.g., grid width and height) may not be changed in such registration and scaling.

CA coordinate registration and scale may be performed or applied in a number of different manners. For example, the scale may be measured using the inspection system (on tool). In one such example, a known feature may be measured in x and y using the inspection system, and the measurements may be compared to the expected size(s) from design to determine the scale factor. In another example, scaling may be applied in the utility. In one such example, if there is a scale error, the scale error will affect the location of the CA as well as their size. In addition, the modified CA component may be loaded into a recipe, and the shift may be measured. Such measurements may be performed to verify that scaling is correct and/or to identify a CA corner using the inspection system and to compare the location of the corner to the expected location to determine shift. Furthermore, the shift may be applied in the utility such that the shift may be used to correct errors that remain after scaling. The modified CA component may also be loaded back into the recipe to verify the shift.

The recipe may then be completed. For example, the CA component may be imported into any suitable storage medium of any suitable system. In one such example, the registered CA component may be imported to a base recipe. In addition, adding CA components may include creating a basic wafer layout using the inspection system (on tool). In this step, a sample wafer may be used by the inspection system to align, to define die size, and to define the wafer map. Creating the basic wafer layout may include these and any other steps that may be performed when setting up an inspection recipe "from scratch." The CA component may be added to or imported into the recipe by adding a test and defining the test parameters. The test parameters may include any suitable test parameters such as mode (e.g., array), optics name, spectral mode (e.g., ultraviolet), imaging mode (e.g., BF), pixel size, focus offset, threshold mode (e.g., fixed), threshold, coverage %, stack tolerance, size sieve, merge, x cell size, run premap, save feature vectors, save image patches, unsupervised grouping, number of groups in unsupervised grouping, run unsupervised grouping, inline ADC, WISE-NF, and test information.

Adding the CA component may also include defining a sensitivity for the test using the CA component. As part of defining the sensitivity of the test, the user may select an "Import Group" option from a user interface to select a CA component. For example, selecting an "Import Group" option or button in a user interface may open a CA component import dialog. The user may then browse to select the desired CA component and by clicking an "OK" button in the dialog, the selected component will be inserted into the CA view. Defining the sensitivity for the test may also be performed using the CA component in combination with best known methods for sensitivity and/or historical inspection results.

After importing the CA component, recipe setup may be continued as is normally or otherwise performed. Furthermore, if using region-based multi-thresholds (RBMT), association of CA with regions may be performed. In one such example, a sensitivity may be defined for each RBMT region, and CA groups may be assigned to RBMT regions (thresholds). In this manner, sensitivity regions may be generated from design. In addition, EDA layout analysis output may be converted to a recipe geometry component (RBMT). The CA component may then be used for recipe setup as described herein. In addition, the recipe setup and optimization may be completed "on tool" such as on an inspection system to create a final recipe. For example the CA component may be stored in a file that can be sent to an inspection system and used on tool for recipe setup and/or optimization.

Creating CA from design improves tool value to both production fabs and research and development fabs in a number of ways. For example, using the CA for inspection can improve random defect detection (e.g., random defect sensitivity), improve systematic defect detection by enhancing the systematic defect sensitivity (e.g., in process window qualification (PWQ) applications), and improve defect classification with region-based classification. In one such example, to improve systematic defect detection, a design for a particular layer may be analyzed to find areas that are more likely to be affected by systematic defectivity. CA may be created from design or GDS to put CA around the candidate areas, and the CA GDS may be imported into the inspection recipe. In another example, for improved defect binning/classification via design data, specific physical features may be labeled with distinct CA group IDs such that those areas can be readily identified in subsequent defect analysis. In this manner, the CA group ID of defects may be used and considered as a defect attribute.

In another embodiment, creating the inspection recipe includes creating the inspection recipe using the first design, the one or more characteristics of the output from scanning the first device using the inspection system, and the second design. For example, in the second part, the recipe for another device (e.g., device B) manufactured using the same process as device A may be created by analyzing the design context for device B and inferring the noise characteristics for the design context for device B from the characterization performed for device A. In an additional embodiment, creating the inspection recipe includes creating the inspection recipe using the first design, the one or more characteristics of the output acquired for the wafer on which the first design is printed, and one or more characteristics of output of the inspection system for a wafer on which the second design is printed. For example, offline RBMT training may include acquiring an image such as a TDI image from an inspection system for a wafer on which the design for device A is formed. The image may be used for noise analysis on the inspection system (on tool) or offline. The noise analysis may be used to generate an image segment map, and the segmentation resolution for the map may be at approximately the pixel level if performed on tool or in microns or at approximately the pixel level if performed offline. The image segment map for device A may be used with one or more design attribute maps for device A, which are partitioned into array areas, logic areas, dummy fill or other "do not care" areas, or segments based on key attributes, to determine yield relevance and noise floor correspondence to design attributes, which may be performed manually or automatically. Such information may be used to generate an offline automatic RBMT setup rule deck. The offline automatic RBMT setup rule deck may be used along with a layout analysis tool to generate CA components for device B and assign each care area component to a particular detection threshold based on the learning from device A. Automatically generating the do not care areas from a design (GDS) may advantageously reduce the inspection area by eliminating a substantial number of dummy patterns from the inspection area. In addition, using CA generated from design, the sensitivity of defect detection can be increased while at the same time decreasing the nuisance rate.

The use of design data for geometrical parameter setting is a relatively straight forward exercise and is not being addressed here. Wafer and die geometrical parameter setup using scanner and reticle layout data may be performed as described in commonly assigned U.S. Pat. No. 6,886,153 to Bevis, which is incorporated by reference as if fully set forth herein. The embodiments described herein may include any step(s) of any method(s) described in this patent.

Inspection recipe setup is a daunting task and getting more so. Various efforts are being made to automate the selection of conditions and parameter values of inspection. Recipe setup may be trivialized to some extent (especially for the front end of the manufacturing process) if the full design hierarchy and the physical cell libraries that are included in the design are available. Due to partitioning within the design-to-manufacturing chain, such access may not be the norm. However, manufacturers more and more frequently have access to some form of the design files for the products that they manufacture in their fabs. This information can be instrumental in improving the time and cost involved in recipe setup as well as effectiveness of the recipe from a capture rate and S/N perspective. For example, a combination of explicit derivation and complimentary inference techniques may be used to help get the most out of the available design and wafer training set information to improve inspection economics.

As described further herein, the embodiments may include representing wafer noise and other wafer properties. The wafer noise concept is described further in commonly assigned U.S. patent application Ser. No. 11/830,485 by Kulkarni et al., filed on Jul. 30, 2007, which is incorporated by reference as if fully set forth herein. The embodiments described herein may include any step(s) of any method(s) described in this patent application.

As described herein, there is a practical benefit for the re-use of noise floor information from device-to-device in inspection recipe setup. Theoretically, one could emulate a noise signature for a relatively complex chip and given inspection conditions using decomposition of the layout for the chip into representative homogeneous regions. This noise signature can, theoretically, be helpful in narrowing down the inspection recipe parameter space to be explored during empirical optimization of a recipe for a new chip design manufactured using the same process as a previous chip design by using a statistical representation of the process noise as a function of local layout attributes and/or a design layout at current and relevant previous layers. Noise statistics and optimum inspection parameter window (not necessarily exact settings) for a new design can be adequately synthesized as a function of layer, technology (specific integrated process flow in a given fab), and local two-dimensional (2D) layout attributes extracted from the design.

Noise floor information for homogenous layout regions (or well parameterized heterogeneous regions) can be acquired empirically from test chips or product die as a function of inspection system illumination mode, optics settings, sensor parameters, algorithm settings, or some combination thereof. Response surface analysis design of experiment (DOE) approaches for efficient coverage of the relevant parameter space are at least touched on by features such as the "optics selector" feature of inspection systems that are commercially available from KLA-Tencor, and such features can be modified to perform one or more of the embodiments described herein. However, even for homogenous structures, the parameter space on inspection systems can be overwhelming. Discerning defects of interest (DOI) from background noise requires judgment in conventional setup approaches.

S/N calibration may be performed using electrically testable proxies and/or test chips. For example, inspection recipes can be highly optimized for S/N on homogenous structures such as test structures. An objective arbiter between signal and noise may be electrical test results such that faults can be used to isolate those defects that killed the structure because of their nature and location. Defects that may potentially cause faults if the defects are located in a different area are DOI and are not adequately comprehended in a test structure-based calibration scheme. Manual review on a training set is an alternative. Response surface analysis and shmoo plot concepts can be used during empirical DOE-based data collection.

During inspection of a given device using a certain inspection recipe, the context noise signature data may be updated with additional statistics determined from detected defects and their classifications (e.g., killer, real, or nuisance/do not care). Inspection results may also be used to determine stability measures for each context that may be useful for creating new recipes (for new devices).

A priori information associated with a context may include criticality of the context (e.g., in terms of yield relevance) and critical area measure for this context. Information associated with a context (context noise signature) for a given device/layer after analysis of a wafer noise map may also include optical mode used for generating the noise map. This information may also include the area of the die occupied by the context. In addition, this information may include distributions of gray level histograms of this context across all dies on the wafer (e.g., distribution of average gray level of this context, distribution of min/max gray levels in this context, distribution of standard deviation of the gray level histogram, and distribution of the $p^{th}$ percentile point in the tails of the gray level histogram, where p may be equal to, for example, about 1%, about 5%, etc.). Such information may further include distributions of the die-to-die or die-to-standard reference die difference histograms (after alignment) for pixels in this context across all dies on the wafer (e.g., distribution of maximum absolute difference and distribution of the $p^{th}$ percentile point in the difference histogram, where p may be equal to, for example, about 0.001%, about 0.1%, etc.).

Information added to the context noise signature as a result of performing inspections may include average number of defects per die detected in this context. Such information may also include variability in defects per die across a wafer. The variability in defects per die across the wafer may be determined based on measures of differences between edge dies (dies located near the edge of the wafer) and dies in the center of the wafer or variability by wafer sector. For example, such information may include variability in number of DOI, real, and nuisance defects across a wafer. The variability may include other measures of differences between edge dies and dies in the center or variability by wafer sector. In addition, this information may include average defect signal (maximum difference) and standard deviation of defect signal across all dies. Such information may further include average estimated size of defects and standard deviation of size and/or average number of DOI, real, and nuisance defects detected per die for all classified defects (classification may be automatic or manual). The information added to the context noise signature may include only one type of the information described above or some combination thereof.

In one embodiment, creating the inspection recipe includes creating a context map by segmenting a die into different region types based on hierarchy of cells, structures, or some combination thereof in the second design. For example, the method may include generating a context map from design data that specifies the die layout using the cell hierarchy information available in the layout. In this manner, a context map may be generated from the cell layout on die. For instance, one method of creating a design-based context map includes subdividing the die area into blocks using the cell hierarchy and layout. In this method, the die may be segmented into regions based on design cell/structure hierarchy. Since the cell hierarchy represents a functional decomposition of the die, the cell hierarchy represents a natural way to segment the die into regions such that each region type represents a distinct arrangement of geometrical features. In addition, the embodiments described herein may be configured for using cell/structure hierarchy to automatically segment the die surface into distinct region types and thus create a design-based context map. The cell hierarchy information may also be used to group regions of a die into distinct categories.

Figure 1A:
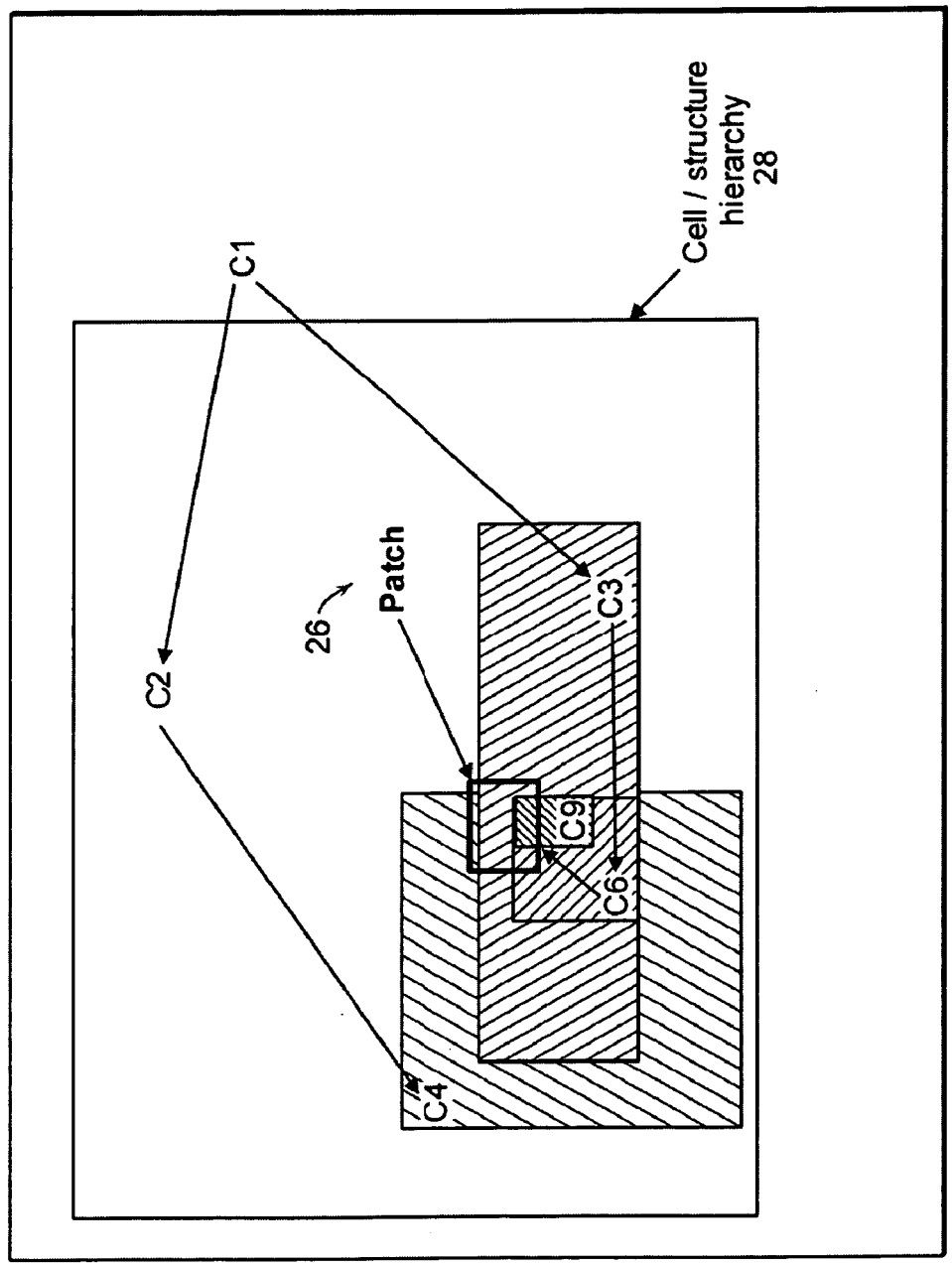
FIG. 1a is a schematic diagram illustrating one embodiment of a patch image whose design context is defined by cells/structures that overlap the patch image.
Figure 2:
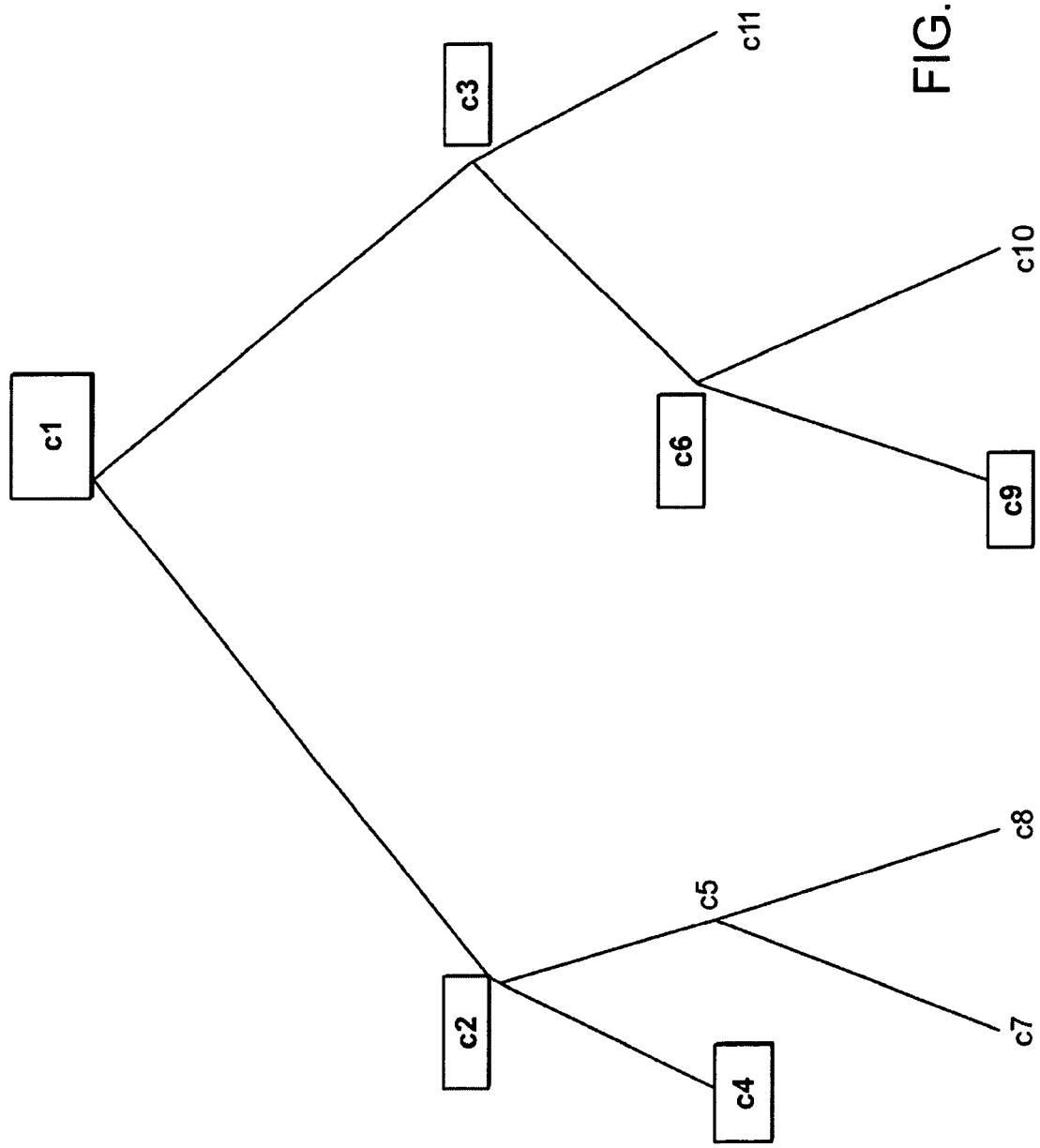
FIG. 2 is a schematic diagram illustrating one embodiment of a patch image whose design context is defined as the paths through the tree structure (cell hierarchy) containing all structures (cells) that overlap the patch image.

The embodiments described herein may include analyzing the structure hierarchy of a chip layout to segment the die into regions and labeling each region with a list of all structures that overlap it. FIG. 1a illustrates one example of patch 26 that can be defined by cell/structures that overlap the patch. Any arbitrary region (patch) on the die can be labeled by the cells in the design layout that overlap the extent of the patch in coordinate space. For example, the patch shown in FIG. 1a overlaps cells C1, C2, C3, C4, C6, and C9 in cell/structure hierarchy 28. The hierarchy of the cells is shown in FIG. 1a by the arrows that point from cell label to cell label (e.g., the arrow from label C1 to label C2 indicates that cell C1 is higher in the cell/structure hierarchy than cell C2). FIG. 2 illustrates one example of the patch shown in FIG. 1a defined as paths through a tree structure containing all structures (cells) that overlap the patch. In this manner, the overlap can be shown as a set of nodes in a tree diagram (such as that shown in FIG. 2), which shows the hierarchy of those nodes in the layout for the device.

Figure 3:
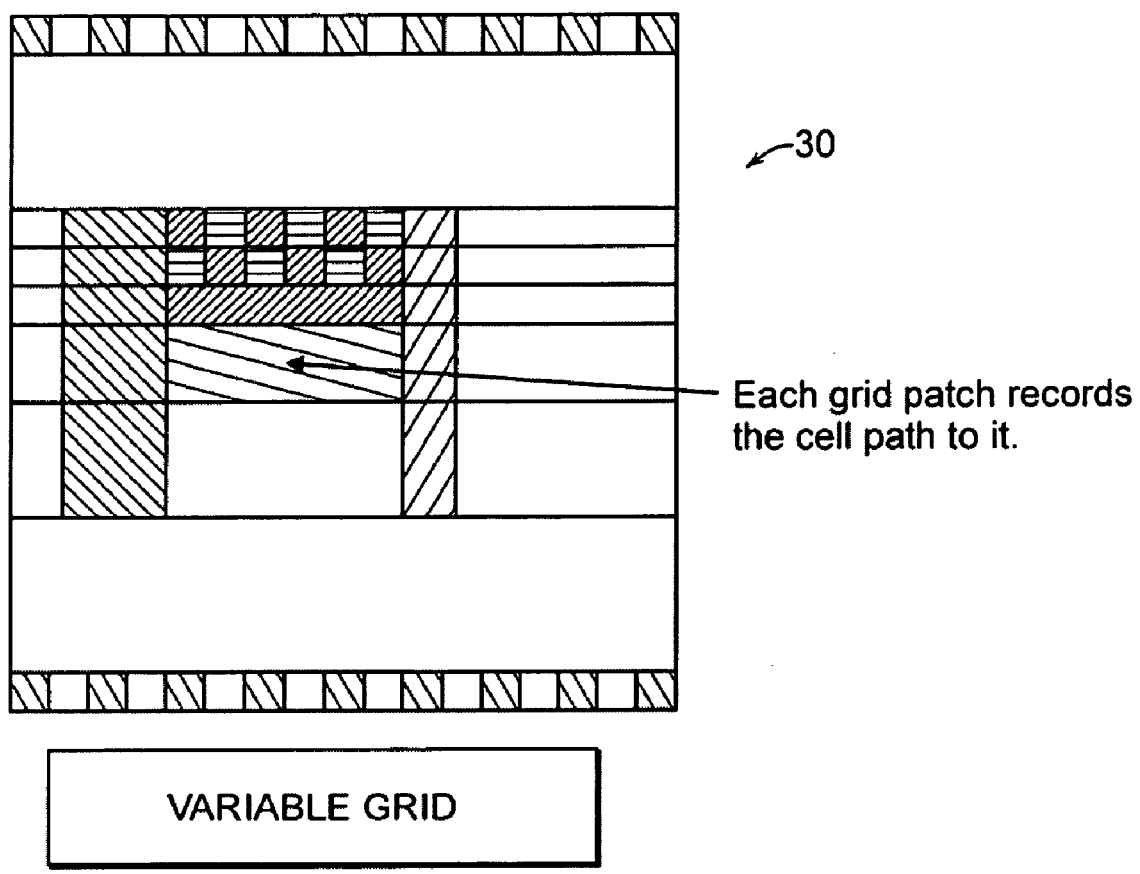
FIG. 3 is a schematic diagram illustrating one embodiment of a die area subdivided into variable sized rectangular blocks (patches), each patch assigned a context type based on its location with respect to the cell hierarchy.

FIG. 3 illustrates one example of die area 30 subdivided into variable sized rectangular blocks (patches). Each patch may be assigned a context type based on the location of the patch with respect to the design hierarchy. In this manner, the die area may be subdivided in a variable grid. FIG. 3 shows how the die surface can be partitioned into non-overlapping rectangles where each rectangle is labeled by the path(s) in the cell hierarchy leading to it (i.e., the cells having an extent that overlaps the extent of the given patch). In this manner, each grid patch records the cell path corresponding to the patch.

Figure 4:
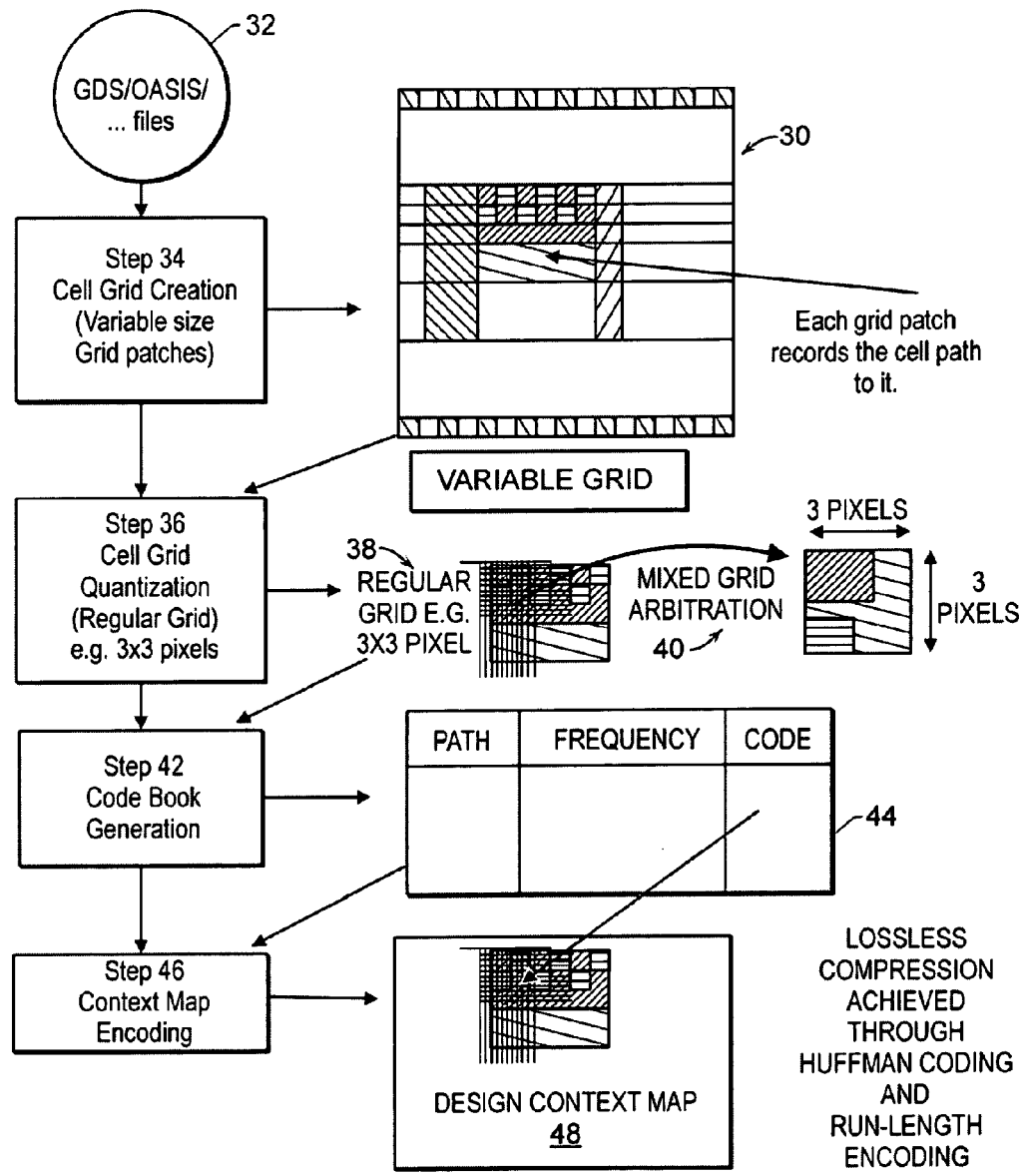
FIG. 4 is a flow chart illustrating one embodiment of encoding steps from design database to design context map.

Regions having the same structure list determined as described above may be grouped into a single design region type. FIG. 4 illustrates encoding steps that may be performed from a design database to a design context map. In particular, FIG. 4 shows a method for encoding die regions based on structure hierarchy, which results in a mapping of regions into design region types. In addition, FIG. 4 shows how such a design-based context map can be digitized on a pixel grid to create an "image" of the map.

In particular, as shown in FIG. 4, design data 32 stored in a data structure such as a GDS file, an OASIS file, or any other suitable data structure, file, or database may be used in step 34 to create a cell grid that includes variable size grid patches. The variable grid may be further configured as described above and shown in FIG. 3. The variable grid may be used in step 36 of the method shown in FIG. 4 to perform quantization of the cell grid into regular grid 38 or pixels. The pixel grid may be defined at the level of the inspection pixel size or some larger size (e.g., 3 pixels by 3 pixels as shown in FIG. 4). Each such pixel (or micro-region) may contain a mixture of design contexts (as shown in FIG. 4), which may be determined by mixed grid arbitration 40, as shown in FIG. 4. If a pixel or micro-region contains more than one design context, some method of prioritizing the contexts may be used to assign a final context ID to the pixel or micro-region. As shown in FIG. 4, the method may include code book generation in step 42 using the regular grid generated in step 36 of the method. The code book may be data structure 44 that includes information about path, frequency, and code.

As shown in step 46 of FIG. 4, the method may include context map encoding using the generated code book to generate design context map 48. Significant (loss-less) compression of this map can be achieved, for example, by Huffman coding (among other methods available in the literature). In Huffman coding, the number of bits used to encode a given context type (since there may potentially be a large number of context types) is inversely proportional to the frequency of occurrence of the context type. Further compression may be achieved, for example, by using run-length encoding, which is a method for compressing information that is known to one of ordinary skill in the art. Thus, a final compressed design-based context map may be created.

In one embodiment, creating the inspection recipe includes creating a context map for the second design using the first design and the one or more characteristics of the output of the first design. Thresholds for each context may be determined. For example, in one such embodiment, creating the inspection recipe includes creating the inspection recipe using the context map such that different sensitivity thresholds for defect detection are applied to output acquired for at least two different contexts in the second design. In addition, inspection regions with different sensitivities may be automatically derived from the context map for the device, and thresholds for each context may be determined. In another such embodiment, creating the inspection recipe includes creating the inspection recipe using the context map such that defects detected by inspecting the wafers on which the second design is printed are classified based on the context map. In an additional such embodiment, creating the inspection recipe includes creating the inspection recipe using the context map such that defects detected by inspecting the wafers on which the second design is printed are grouped based on the context map. In a further such embodiment, creating the inspection recipe includes creating the inspection recipe using the context map such that systematic defect mechanisms in the second design are detected using results of inspecting the wafers on which the second design is printed and the context map.

Classifying, grouping (or binning), and detecting systematic defect mechanisms as described above may be performed in run time mode. For example, the context map may be created as described above and shown in FIG. 4. This map may be used by the wafer inspection system to, for example, control sensitivity in different regions and to classify (bin) defects by their design context. In addition, this context map may be used to apply different sensitivity thresholds for defect detection, to group or classify defects, and to detect systematic defect mechanisms. For example, the context map can be used to create an inspection recipe that automatically defines regions of the die that can be inspected with different detection sensitivities and/or to classify defects found by a semiconductor device inspection system into one or more different random and systematic categories. In addition, sorting the die surface based on function as described herein provides a natural way to group defects and detect systematic defect mechanisms that would tend to cluster in a few region types. Furthermore, such a context map may be used to create a sample plan for review of defects that occur in different contexts. In addition, specific physical features on the wafer or in the design and/or detected defects may be "labeled" with distinct CA group IDs or context IDs, and those IDs can be used to readily identify the physical features or defects in subsequent defect analysis, which may include any suitable defect analysis. Applying different sensitivity thresholds for defect detection, grouping or classifying defects, and detecting systematic defect mechanisms using such a context map may also be performed as described in the above-referenced patent applications by Kulkarni et al. and Zafar et al.

Figure 4A:
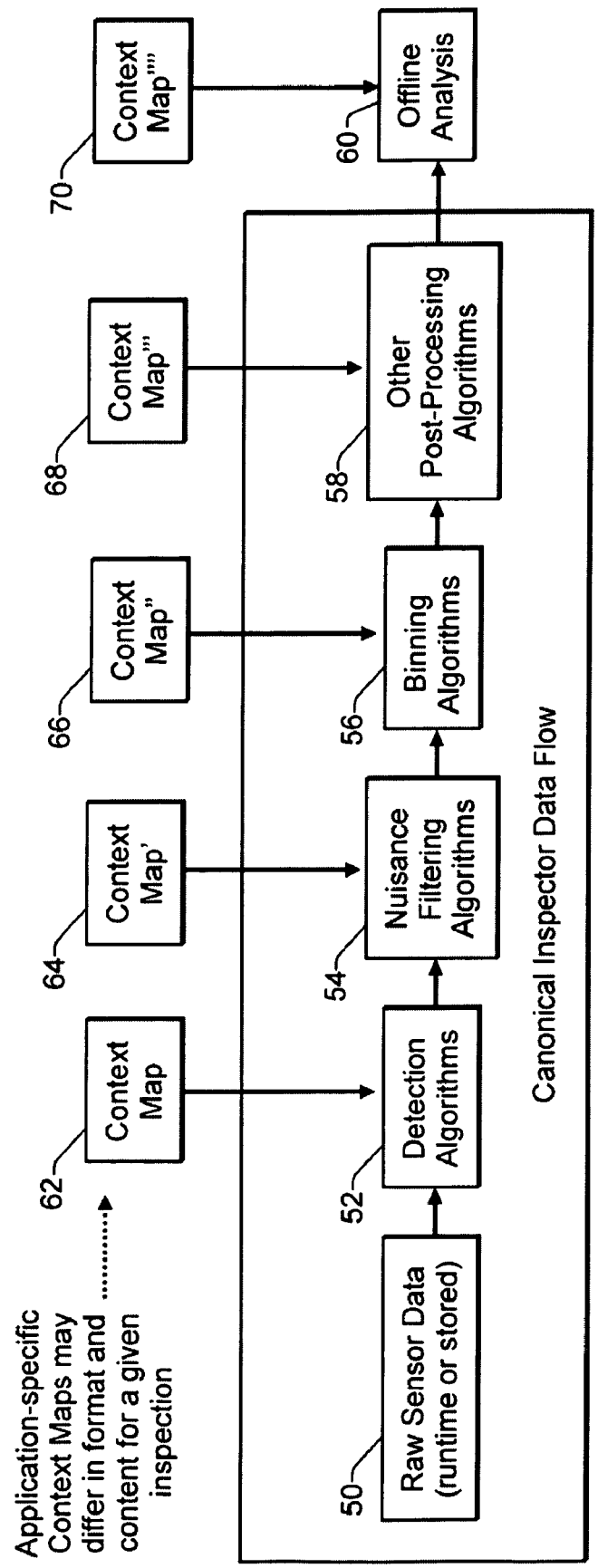
FIG. 4a is a flow chart illustrating one embodiment of a canonical inspection system data flow.

In another embodiment, different context maps may be used for different applications during inspection. For example, FIG. 4a illustrates one example of an inspection-application data pipeline with application-specific context maps as input. For example, as shown in FIG. 4a, a canonical inspection system data flow may include raw sensor data 50 (runtime data or stored data) to which one or more detection algorithms 52 may be applied. The one or more detection algorithms may include any suitable detection algorithm(s). One or more nuisance filtering algorithms 54 may be applied to defects that are detected by application of the one or more detection algorithms to the raw sensor data. The one or more nuisance filtering algorithms may include any suitable nuisance filtering algorithm(s). One or more binning algorithms 56 may be applied to the output of the one or more nuisance filtering algorithms. For example, one or more binning algorithms may be applied to the non-nuisance defects (e.g., defects that are not filtered out of the defect population detected by the one or more detection algorithms). The one or more binning algorithms may include any suitable binning algorithm(s). One or more post-processing algorithms 58 may be applied to output of the one or more binning algorithms. The one or more post-processing algorithms may include any suitable post-processing algorithms, which may be configured to perform one or more post-processing steps described in the above-referenced patent applications to Kulkarni et al. and Zafar et al. In addition, any of the algorithms described herein may be configured to perform detection, nuisance filtering, and binning as described in these patent applications. Offline analysis 60 may be performed on the output of the one or more post-processing algorithms. The offline analysis may include any suitable offline analysis such as any one or more steps described in the above-referenced patent applications to Kulkarni et al. and Zafar et al.

As further shown in FIG. 4a, application-specific context maps may be used at each step in the canonical inspection system data flow described above. The application-specific context maps may differ in format and context for a given inspection step. For example, different context maps may be used for defect detection, nuisance filtering, binning, other post processing, and offline analysis. In particular, context map 62 may be used with detection algorithm(s) 52 to detect defects on the wafers. Context map' 64 may be used by nuisance filtering algorithm(s) 54 to filter nuisance. Context map" 66 may be used by binning algorithm(s) 56 to bin defects. Context map'" 68 may be used by other post-processing algorithm(s) 58, and context map"" 70 may be used by offline analysis 60. The different context maps may be used at each of these steps as described further herein and as described in the above-referenced patent applications by Kulkarni et al. and Zafar et al.

Defining regions with different detection sensitivities as described above advantageously allows capture of critical defects that occur in certain contexts, without overwhelming the system or inspection results with process noise from other (less critical) context areas. For example, the design at a particular layer can be analyzed to find high noise features (e.g., dummy features, registration marks) that can be removed from the inspection, designated as do not care areas, or separated into a different sensitivity region to thereby decrease nuisance rates. Separating defects by context as described above advantageously provides information that can be used to help design and/or manufacturing engineers to modify the design and/or fabrication process appropriately to correct one or more defect-causing mechanisms and improve yield. When "auto-thresholding" algorithms are used for defect detection, segmenting a die by regions of like characteristics with a context map can, in and of itself, be advantageous for inspection sensitivity even without explicitly setting different sensitivities by region.

Instead of digitizing the context map into an image format, one can maintain the context map in design space (e.g., down to nanometer resolution) as a set of rectangles. The coordinates of these rectangles can be used by the wafer inspection system to, for example, control sensitivity in different regions and to classify (bin) defects by their design context.

In one embodiment, creating the inspection recipe includes creating a context map for the second design using the first design and the one or more characteristics of the output and creating the inspection recipe using the context map. In one such embodiment, the context map includes different context types in the second design, and creating the context map includes merging different context types that have similar one or more characteristics of the output and similar noise characteristics of the output. In this manner, a context map may be generated from image characteristics. For instance, the image properties of regions may be analyzed (e.g., compared to one another) to group these regions based on noise levels and appearance. Regions that have at least similar noise levels and appearance may be grouped together and separate from regions that have different noise levels and appearance. Thus, defect detection thresholds may be lowered in regions that have relatively low process noise thereby allowing for more sensitive inspection in those areas.

In some such embodiments, mapping may be performed between context and optical characteristics. For example, mapping may be performed between the design-based context types (regions) described above and the image-based contexts described above. For example, even though analysis of the design layout may result in hundreds or thousands of different context types, wafer inspection systems may not be able to distinguish between all of the context types due to the resolution limitations of the inspection systems. Thus, several design contexts may be mapped or merged into one group based on the image characteristics of the design contexts. In this manner, design contexts that look "similar" as far as the inspection system is concerned may be merged. Conversely, similar design contexts may appear different to the inspection system, for example, due to orientation of the geometry corresponding to the design contexts with respect to the imaging architecture. In a similar manner, a design context may be distinguished or split into two or more sub-contexts if different portions of the design context appear different to the inspection system. The merge/split operations may be performed as described further herein.

A context mapping of a die is any partitioning of the die area into non-overlapping rectangular regions that may be relatively large (e.g., several hundred micron square) or relatively small (e.g., 3 pixels×3 pixels or 5 pixels×5 pixels, and the pixels may be as small as about 50 nm). This map may be a regular grid (e.g., made up of cells, each N×N pixels tessellated across the die) or irregular (i.e., non-overlapping rectangular regions of different sizes that together cover the die). This partitioning may be generated by an EDA tool such as place and route software, which can output the die layout (with a symbolic name for each block type), a congestion map that specifies the density of interconnects of each region of the die, or any other analysis tool that partitions the die into regions based on function, defect sensitivity, or some other criterion.

Just as many design contexts may be defined based on layout, criticality, design margins, etc., image characteristics (e.g., one or more characteristics of one or more images acquired by a wafer inspection system) of each die region can be also be grouped into image contexts. Therefore, before contexts are used to define regions for inspection with different sensitivities, it may be convenient to merge "inspection system-equivalent" contexts provided that their criticality measures are not radically different. For example, a given design context may be split into sub-contexts based on image characteristics of sub-regions of those contexts. Alternatively, many design contexts may be mapped to the same image context because these design contexts may appear similar in appearance and noise characteristics to the imaging subsystem of the wafer inspection system.

Figure 5:
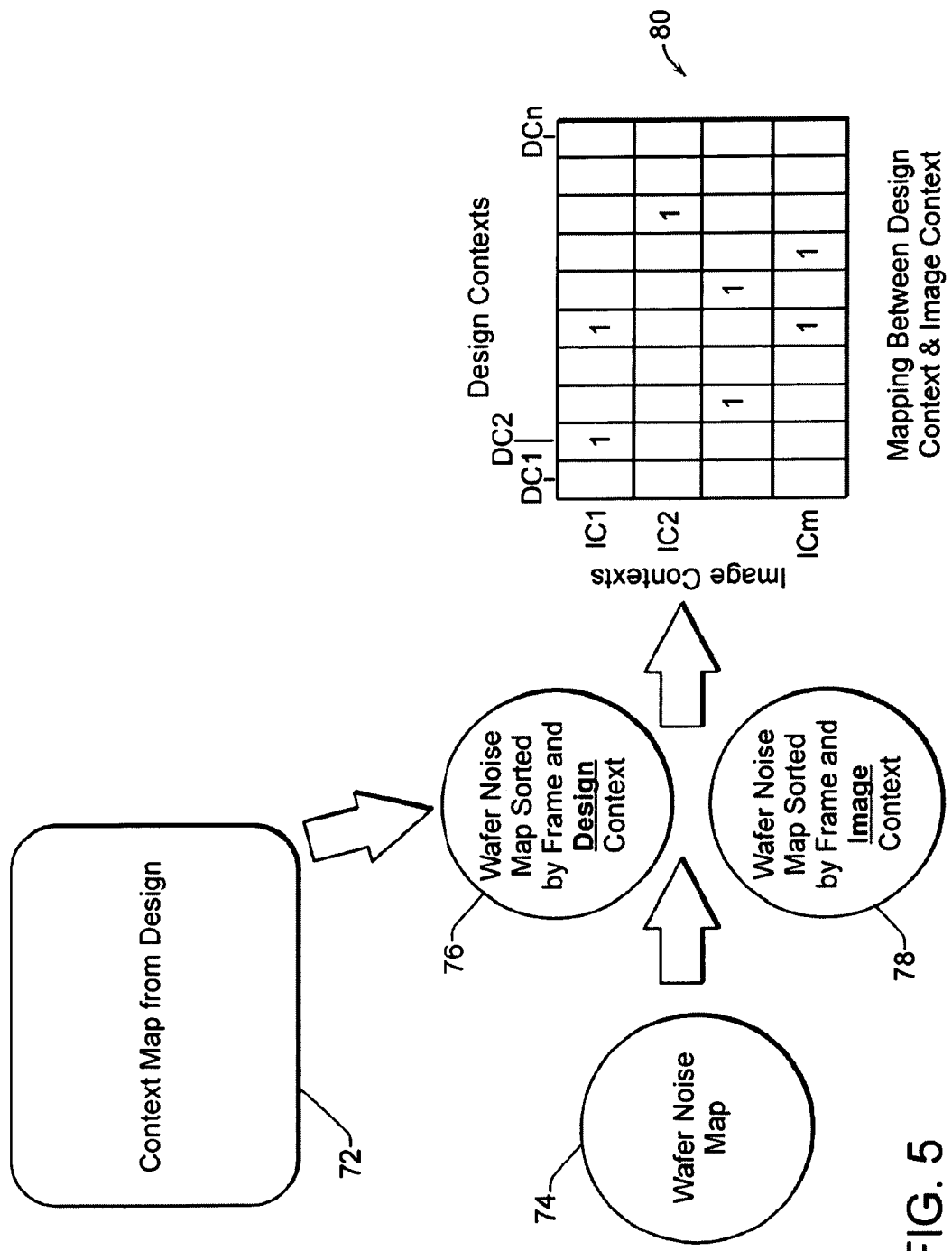

One example of mapping design context to image context is shown graphically in FIGS. 5 and 5A. For example, as shown in FIG. 5, context map 72 generated from design may be used with wafer noise map 74 to generate wafer noise map 76 sorted by frame and design context. In addition, context map 72 generated from design may be used with wafer noise map 74 to generate wafer noise map 78 sorted by frame and image context. As further shown in FIG. 5, the wafer noise maps sorted by frame and design context and sorted by frame and image context may be used to generate mapping 80 between design context and image context in which the image contexts are mapped along one axis of a grid and the design contexts are mapped along a different axis of the grid. In addition, as shown in FIG. 5A, image context analysis 82 may be performed to merge image contexts 84, which may be performed as described herein. Therefore, mapping 86 between design and image context may be performed using results of design context analysis 88 and results of merging the image contexts 84. In this manner, the mapping shown in FIG. 5A may include 1:1 mapping of design context to image context, mapping of multiple design contexts to a single image context, and mapping of a single design context split into multiple image contexts.

One method of merging design contexts may be to use a similarity measure between the noise signatures of the contexts. For example, treating the noise signature measures listed above as a feature vector in N-dimensional space, contexts having feature vectors that are similar may be merged. A nearest-neighbor rule may be used to cluster contexts. Some heuristics that may be used in the clustering may include:

if the criticality values of the contexts are relatively far apart, the contexts are not merged;

if the gray level distributions of the contexts are substantially different, the contexts are not merged;

if the difference histograms of the contexts appear substantially different even if the gray level distributions are similar, the contexts are not merged;

if one context has a relatively high variability across a wafer and another context does not, even if both contexts exhibit similar gray level distributions and difference distributions on an average, the contexts are not merged;

if the image context vectors for a given design context have a relatively wide variance in image properties, the design context may be split into sub-contexts based on clustering the corresponding image contexts into subgroups such that cells within a subgroup are similar to each other and differ from those in another subgroup;

or some combination thereof.

The above rules may be enforced to ensure that contexts are merged only if the contexts have a similar level of criticality, similar gray level distributions, and similar die-to-die or die-to-standard reference die difference distributions.

Figure 6:
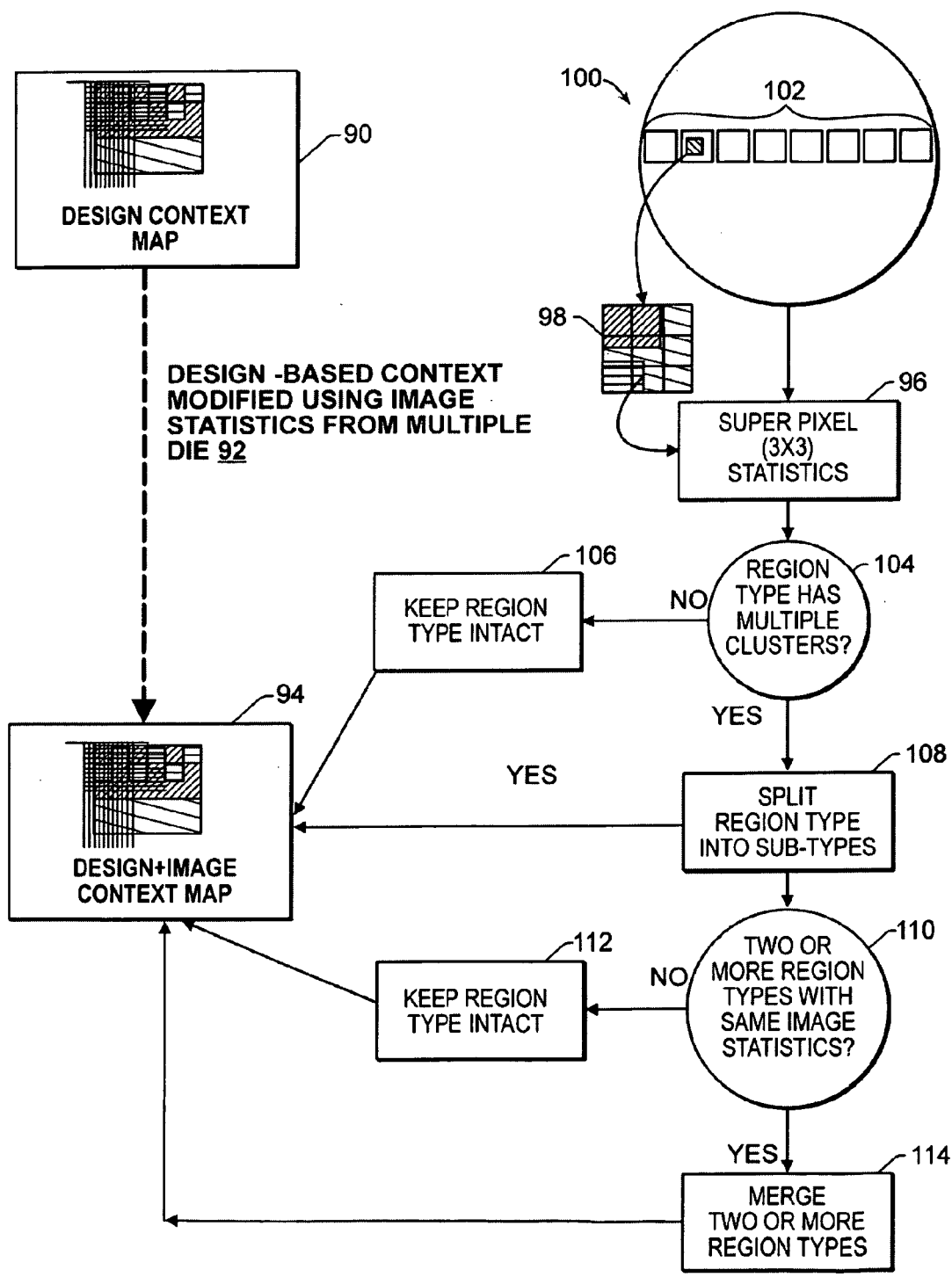
FIG. 6 is a flow chart illustrating one embodiment of a method for splitting/merging design context types based on image statistics derived from a scan of multiple sample die printed using the given design.

In one embodiment, the method includes determining multi-die statistics for different context types in the first design using the one or more characteristics of the output and splitting at least one of the different context types into context sub-types based on appearance and noise levels of the output, and creating the inspection recipe includes creating the inspection recipe using the first design, the one or more characteristics of the output, and the context sub-types. For example, a process for splitting and/or merging image and design context information to create an inspection context map is shown in FIG. 6. In particular, FIG. 6 illustrates one embodiment of a method for splitting and/or merging design context types based on image statistics derived from a scan of multiple sample die. In addition, the method may include automatically segmenting a die into regions based on design cell/structure hierarchy and image properties derived from a scan of one or more die on a sample wafer. For example, the method shown in FIG. 6 may include splitting region types into sub-regions or merging region types with similar image statistics (derived from scanning several dies on a wafer) to define the final set of regions for the inspection recipe. In this manner, as shown in FIG. 6, design context map 90 and design-based context modified using image statistics from multiple die 92 may be used to generate design and image context map 94. For example, as shown in FIG. 6, "super-pixel" (e.g., 3 pixel by 3 pixel) statistics 96 may be determined for micro-region 98 in a die on wafer 100. In particular, die row 102 of sample wafer 100 may be scanned and statistics determined for each micro-region (e.g., 3 pixels by 3 pixels) of the regions defined as described above.

The super-pixel statistics may be used in step 104 to determine if the region type has multiple clusters. If the region type does not have multiple clusters, the method may include keeping the region intact, as shown in step 106. If the region type has multiple clusters, the method may include splitting a region type into sub-types, as shown in step 108. For example, if a region type exhibits different sub-populations of micro-regions based on the imaging properties, then that region type may be split into sub-regions accordingly. In this manner, the embodiments described herein may be configured for gathering multi-die statistics from an image of each design context type and splitting a context type into sub-types based on appearance and noise levels.

The method may also include determining if two or more region types have substantially the same image statistics, as shown in step 110. If the region types do not have substantially the same statistics, the region types may be kept intact, as shown in step 112. If the region types have substantially the same image statistics, the method may include merging the region types, as shown in step 114. In this manner, if two or more region types are indistinguishable based on their imaging properties, the two or more region types may be merged into a single region type. As such, the embodiments described herein may be configured for merging region or context types that have similar image properties and noise characteristics.

As further shown in FIG. 6, the intact region types, the split region types, and the merged region types may be used to create or modify design and image context map 94. As such, the split/merge operation performed for the design region types based on image properties may result in the final inspection region types.

Figure 6A:
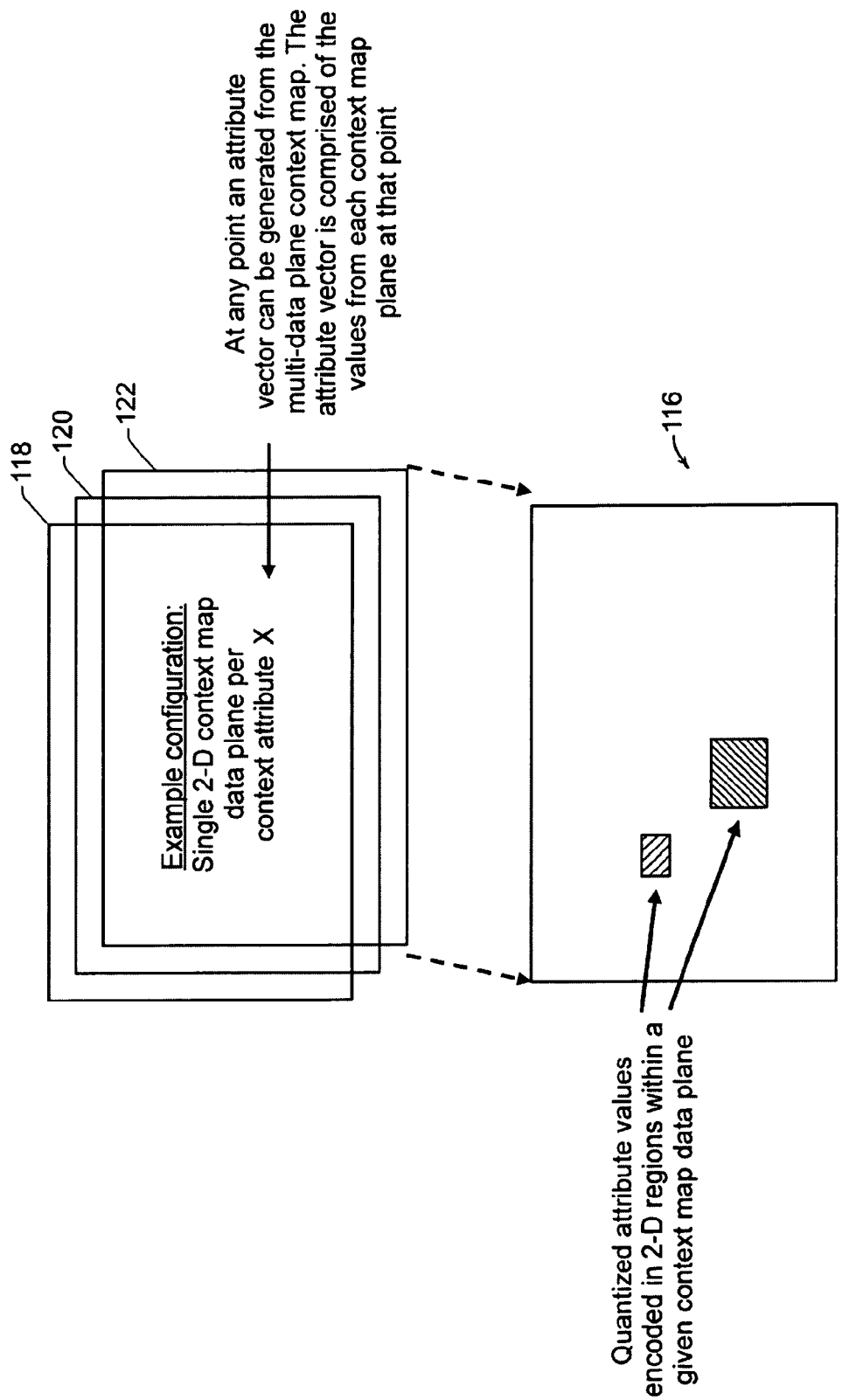
FIG. 6a is a schematic diagram illustrating one embodiment of a configuration of a multi-data plane representation of a context map.

As described above, if a pixel or micro-region contains more than one design context, some method of prioritizing the contexts may be used to assign a final context ID to the pixel or micro-region. In addition, a context map may be generated for multiple attributes. For example, as shown in FIG. 6a, in one example configuration of a multi-data plane context map, a single 2D context map data plane may be generated per context attribute. For example, individual context map data planes 118, 120, and 122 may be generated for different context attributes. Each data plane can be divided into regions, each of which is assigned a quantized value for the particular attribute represented by that context map plane. As further shown in FIG. 6a, at any point in such multi-data plane context maps, an attribute vector can be generated from multi-data plane context map 116. The attribute vector may include the values from each context map plane at that point.

In one embodiment, the second design is not used in the method. For example, the embodiments described herein may include automatic learning of the mapping between image and design context. For instance, as described above, the design data, wafer noise map, and image data for a given device (e.g., device A) may be used to synthesize an inspection recipe for a new device (e.g., device B) manufactured using the same process as device A. So far, we have assumed that the design data for device B is available for use in the methods described herein. However, if the design layout for device B is not available for use in the methods described herein, a mapping can still be determined using the design and image of device A.

Figure 7A:
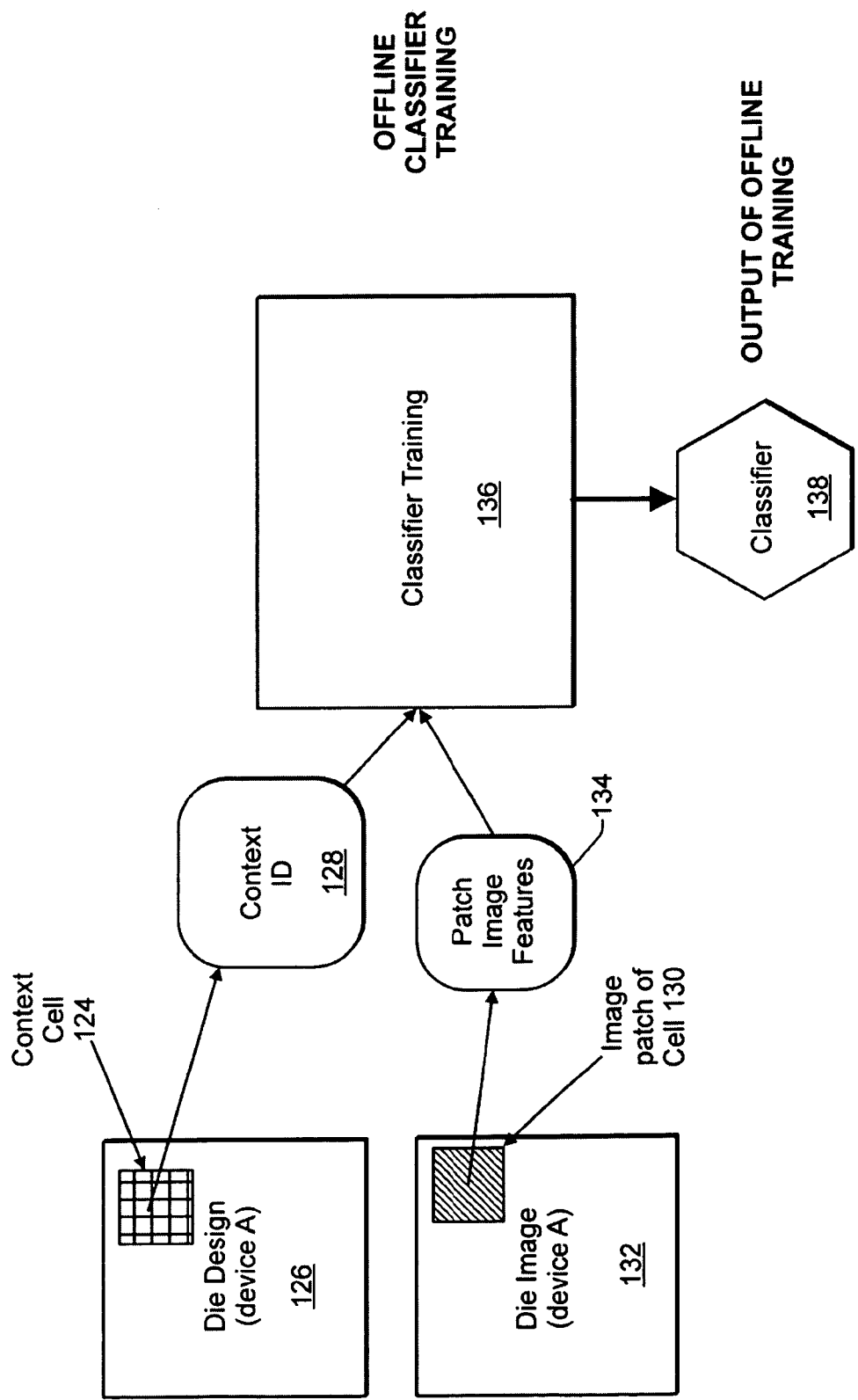
FIG. 7a is a flow chart illustrating one embodiment of offline training of a classifier that maps image patch features to design context ID.
Figure 7B:
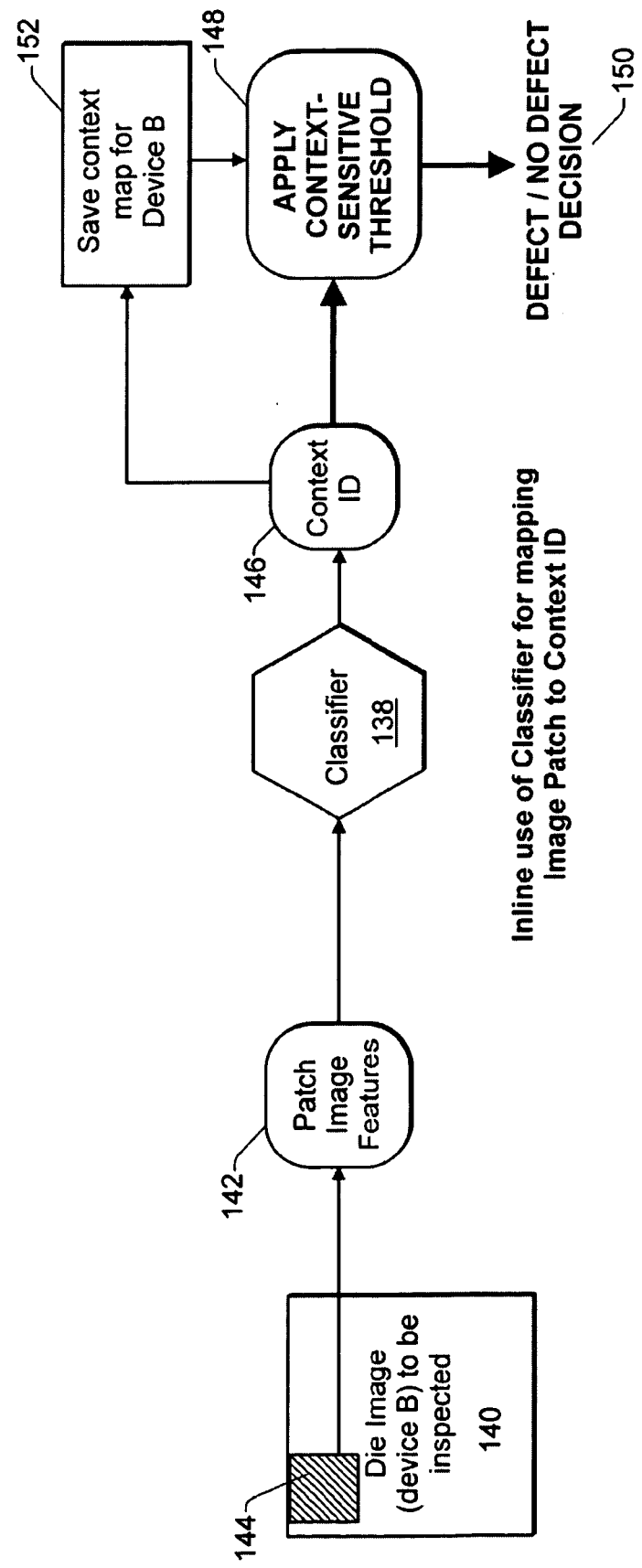
FIG. 7b is a flow chart illustrating one embodiment of inline use of previously constructed classifier for mapping an image patch of a new device to a context identity.

As described above, in one embodiment, creating the inspection recipe includes creating a classifier that maps different portions of the first design and the one or more characteristics of the output acquired for the wafer on which the first design is printed. In one such embodiment, creating the inspection recipe also includes acquiring output of the inspection system for a wafer on which the second design is printed, determining one or more characteristics of the output acquired for the wafer on which the second design is printed, and assigning a context ID to different portions of the second design using the one or more characteristics of the output acquired for the wafer on which the second design is printed and the classifier constructed using the first design. For example, the basic concept of inline use of a classifier for mapping an image patch to a context ID is shown in FIGS. 7a and 7b. In particular, FIG. 7a illustrates offline training of image-to-design context mapping. For example, FIG. 7a shows how the design layout of a chip (device A) and the image acquired from an inspection scan of the chip (device A) can be used to create a mapping function (a classifier) that maps an image patch into its most probable context. In particular, as shown in FIG. 7a, context cell 124 for die design 126 for device A may be used to determine context ID 128. In addition, image patch 130 of a cell in die image 132 for device A may be used to determine one or more features 134 of the patch image. The context ID and the one or more features of the patch image may be used for classifier training 136. The classifier training may be performed offline. For example, the classifier training may be performed offline after the die image (of device A) has been stored. The classifier training may be used to generate classifier 138. In this manner, the classifier may be included in output of offline training.

The die may have many examples of a particular context so there may be adequate samples of the particular context for training the classifier. In addition, the misclassification rate of the classifier may be determined since it is possible that many contexts are indistinguishable to the inspection systems (i.e., the images of the contexts may appear substantially similar in feature space). The features used in the classifier may be the raw pixel data or signals themselves or features derived from the raw pixel data or signals such as features used in iADC to classify the background. The "ground truth" or "true classification" is provided by the design context. The granularity ("context cell") of the design context may be relatively coarse (e.g., about 1 μm by about 1 μm) or relatively fine (e.g., about 0.1 μm by about 0.1 μm or about 1 to 2 design rules in size).

The output of this training is basically a function (e.g., a lookup table or a set of training feature vectors for a nearest-neighbor classifier or rules, or hybrid or a neural net) that represents the classifier. During an inspection scan (see FIG. 7b), die image 140 of the device (device B) to be inspected is acquired. The image may be separated into the appropriate granularity (into context cells). As shown in FIG. 7b, one or more patch image features 142 may be determined from image patch 144 in die image 140. The features may be extracted from the cell, and the cell may be classified using the previously-trained classifier 138 and the one or more features of the patch image. The output of the classifier is context ID 146. Then, the appropriate threshold is applied to the pixels in that context cell. In this manner, a context-sensitive threshold may be applied, as shown in step 148, to make defect/no defect decision in step 150.

In one embodiment, creating the inspection recipe includes creating a context map for the second design using the first design and the one or more characteristics of the output and storing the context map in the inspection recipe such that inspection is performed using the context map. In another embodiment, the results of classification of contexts on the second design are stored in a context map and used for subsequent inspections of that design without requiring use of the classifier on subsequent wafers inspected. For example, the classification method described above can be applied once to an image of device B, and the resulting context ID map can be stored offline, as shown in step 152 of FIG. 7b. This map may then be downloaded and used during the inspection of each die on subsequent device B wafers without having to determine the context ID as described above each time a device B wafer is inspected thereby saving valuable computing resources.

In one embodiment, creating the inspection recipe includes selecting an optics mode for the inspection recipe using a scoring function based on the first design, the one or more characteristics of the output, and defect detectability in different optics modes for different design contexts present in the first design. For example, the embodiments described herein may include selecting the best or optimal imaging mode by using a scoring function that is based on design information (e.g., context), imaging characteristics (e.g., noise), and defect detectability measures (e.g., S/N). In one such example, the optimal imaging mode for the inspection recipe for device B may be selected by maximizing a scoring function that utilizes context, chip area, and defect detection capability information for each context and each mode. In this manner, a cost function may be used for optics mode selection. For example, a fundamental challenge in recipe creation is selecting the "best" optics mode for a given layer. However, a given optics mode may not necessarily provide the best defect detection signal for all contexts. Each device may also have different proportions of contexts. Thus, the best optics mode for a given device will be a function of (a) die area occupied by a context, (b) criticality of the context, and (c) defect detectability in that context with a given optics mode.

Basically, the optics mode may be selected such that some function $Sum_{all\ context}[F(context\ criticality, context\ area, context\ defect\ detectability)]$ is maximized. For example, $F( )$ may be a product of $C_k * A_k * D_k$, where k is the context index, and $C_k$, $A_k$, and $D_k$ are, respectively, the criticality, area, and defect detectability of context k for this optics mode. Context criticality may be obtained from software that analyzes the design to identify weak points in the design such as Design Scan or design rule checkers that are available from various ECAD vendors. The weak points in the design may also be identified as described in the above-referenced patent applications by Kulkarni et al. and Zafar et al. Context area may be derived from the layout itself. Defect detectability may be determined from inspection results based on the number of real/DOI defects caught in this context versus nuisance defects, or the ratio of defect S/N for this context in the given optics mode.

Peak events may be used to compare optics modes. For example, a problem with evaluating different optics modes is the time required to scan the wafer under different modes and to classify manually (perhaps on a SEM review tool) the defects that each mode detects. One question that arises is if there is a way to determine if different optics modes catch different defect types without performing extensive manual classification.

A "peak event" correlation between optics modes may be used to determine the coincidence between modes and to determine whether certain optics modes capture unique defect types (i.e., a defect type that is captured in one mode but not in others).

Since a given mode captures a defect as an outlier in the distribution of pixel differences (die-to-die), it follows that if a reasonably aggressive threshold is set that captures DOI along with some level of nuisance defects, then comparing the defect locations across optical modes allows determining which defects are caught in each mode. Thus, a Peak Event Detection Matrix, PEDM[ ], can be constructed in which the $[i, j]^{th}$ entry denotes the number of peak events that were caught by both optics mode i and optics mode j for i not equal to j. PEDM[i, i], the diagonal entries, denote the total number of peak events caught in mode i. The number of unique defects U[i] caught only by mode i and not by any other mode may also be determined.

If the context map for the die is known, the matrices PEDM[ ] and U[ ] can be determined for each context, k. These matrices may be denoted as $PEDM_k[i, j]$, $U_k[i]$.

Given the above matrices, the delectability measure for a given context k and mode i can be determined and denoted as D[k, i] using the following expression:

$$D[k,i]=W_1 * U_k[i] + W_2 * PEDM_k[i,i]$$

in which $W_1$, $W_2$ are weights. Therefore, D[k, i] is a weighted sum of the unique events caught by mode i and the total number of events caught by mode i.

It may also be useful to have a measure of the "common" defects caught by two modes, i and j. This measure, called the optics correlation matrix, $OCM_k[i, j]$ for context k can be determined as:

$$OCM_k[i,j]=PEDM_k[i,j]/\{PEDM_k[i,i] * PEDM_k[j,j]\}^{1/2}$$

This measure captures the commonality between the two modes as far as defect capture is concerned.

The scoring function for optics mode i is thus given by:

$$Score[i]=Sum_{all\ k}\{C_k * A_k * [W_1 * U_k[i] + W_2 * PEDM_k[i,i]]\}.$$

A useful measure comparing two modes may be the contribution to the above total score by events caught in common between modes i and j. This score, denoted by Score[i, j], is given by:

$$Score[i,j]=Sum_{all\ k}\{C_k * A_k * W_2 * PEDM_k[i,j]\}$$

Classified peak events may be used to compare optics modes. For example, if the peak events in each optics mode are reviewed and manually classified, the matrices $U_k[\ ]$ and $PEDM_k[\ ]$ may be partitioned by defect type, and a given mode may be scored by giving positive weights for real defects and negative weights for nuisance defects detected in that mode. Thus, if the weight of a defect of type 1, $V_1$, is a positive number for DOI and real defects and a negative number for nuisance, the above equation can be written as:

$$Score[i]=Sum_{all\ k}\{C_k * A_k * [W_1 * Sum_{all\ 1}(V_1 * U^1_k[i]) + W_2 * Sum_{all\ 1}(V_1 * PEDM^1_k[i,i])]\}.$$

In the above equation, $U^1_k[i]$ denotes the number of unique defects of type 1 caught in mode i belonging to context k, and $PEDM^1_k[i, i]$ denotes the total number of defects of type 1 caught in mode i belonging to context k.

A modification of the above method may be to measure the average signal from a real defect to the maximum signal from a nuisance defect for a given mode. If for context k, $SNRU_k[i]$ denotes this ratio for the unique defects caught by the mode and $SNR_k[i]$ denotes the ratio for the entire set of defects caught by the mode, a weighted sum similar to the above equation can be used to score each mode.

Alternatively, both the defect counts and the S/N measures can be combined to score a mode.

Defect models may also be used to compare optics modes. For example, in many cases, real examples of defects in certain critical die locations may not be available. The signal that would be obtained from a defect of a given size in a given location of a die may be simulated (using software programs such as electromagnetic (EM) simulation software). This simulation may be performed for a variety of imaging modes and with a variety of die contexts. The defect signal for each combination of mode and context may also be used in the scoring function to evaluate the best imaging mode.

Figure 8:
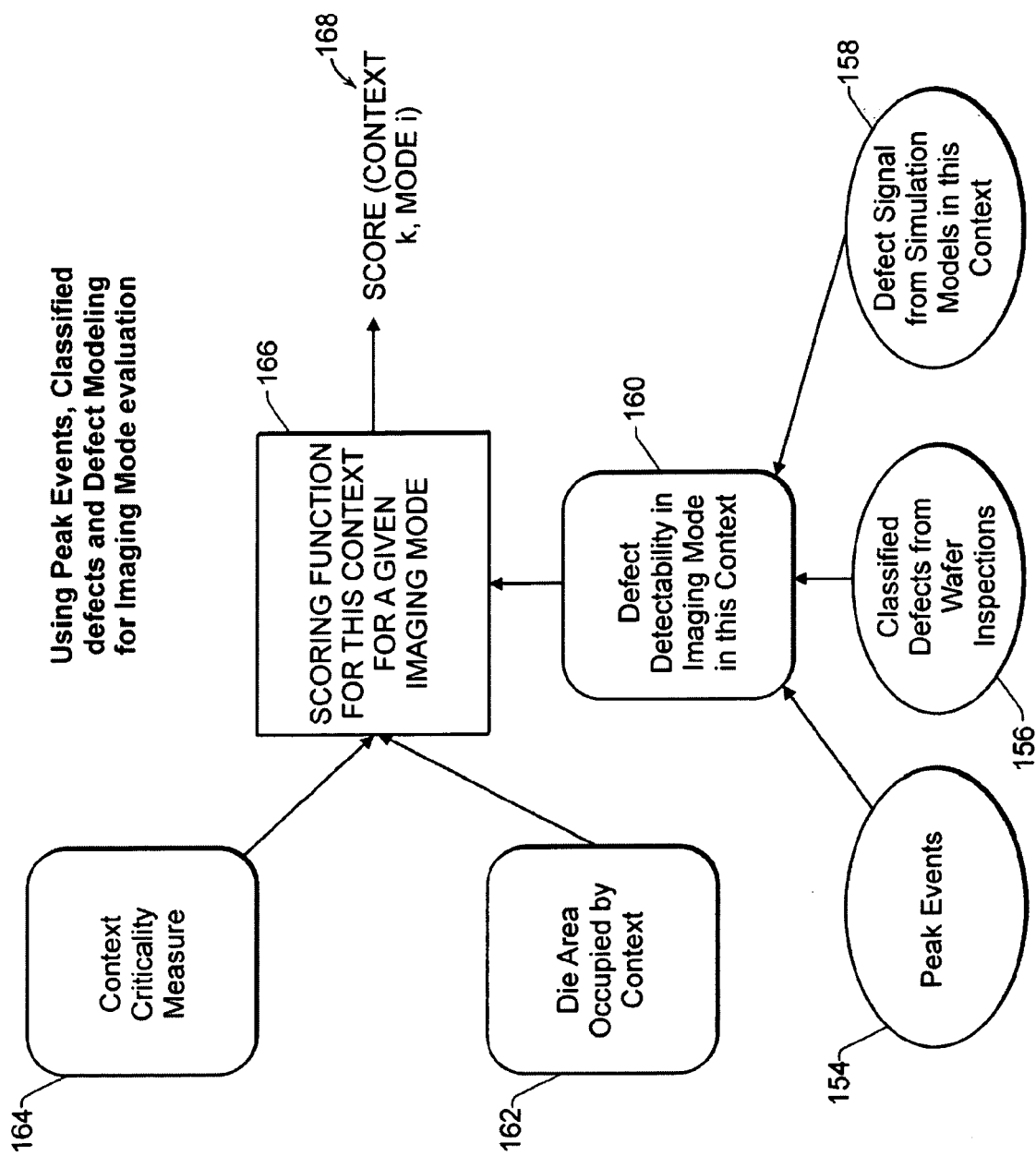
FIG. 8 is a flow chart illustrating one embodiment of a scoring function that evaluates each imaging mode for each design context, using context criticality, die area occupied by the context, and defect detectability in that imaging mode for that context, the latter using peak events, classified defects, and defect signal simulation.

The various information that may be used in mode evaluation is depicted in FIG. 8. In particular, FIG. 8 illustrates one embodiment for using peak events, classified defects, and defect modeling for imaging mode evaluation. For example, as shown in FIG. 8, peak events 154, classified defects from wafer inspections 156, and defect signal from simulation models in a context 158 may be used to determine defect detectability in an imaging mode in this context 160. This defect detectability, the die area occupied by the context 162, and the context criticality measure 164 may be used to determine a scoring function for this context for a given imaging mode 166, and the score 168 may be expressed as a function of context k and mode i, as shown in FIG. 8.

The embodiments described herein may include automatic CA generation and threshold setting. For instance, having selected the optimal optics mode using the method described above, the next step may be to create CA corresponding to the different contexts. The elementary contexts may be merged (for the chosen optics mode) using the merging rules described above. The resulting merged contexts may then be assigned to unique region types, and the threshold for each region type may be selected to catch outliers using the wafer noise map (for device A). The noise map may include, for each context, the difference histogram statistics across the wafer. In addition, a context map or region types determined as described herein may be used to apply different sensitivity thresholds for defect detection as well as to group or classify defects and/or to detect systematic defect mechanisms.

The embodiments described above may also or alternatively include using a combination of stored die images and empirical or modeled inspection results for a representative range of inspection conditions to establish a model for building optimized inspection recipes for future devices directly from design databases. These concepts may be coupled with noise floor concepts in the methods described herein for mapping design contexts to image contexts and using a scoring function to evaluate imaging modes and to select the best mode for inspection such that the die region criticality, the area covered by that context type, and the ability to detect defects in that context for that mode, are factored into inspection recipe creation.

In alternative embodiments, ad hoc methods or iterative methods may be used for inspection recipe creation in which die partitioning is performed by the operator with knowledge about the die layout. Imaging modes determined from prior experience or from image formation models may be used for inspecting the wafer during recipe setup. By iteratively modifying the detection thresholds in each region and reviewing defects (to distinguish real defects from nuisance defects), the optimum imaging mode may be selected.

The embodiments described herein have a number of advantages over previously used methods and systems for inspection recipe creation. For example, automatically defining regions of a die in which defect detection is to be performed using varying detection thresholds is important for maximizing sensitivity to DOT in critical die regions (critical design contexts) while not detecting millions of nuisance defects in other parts of the die. Therefore, the embodiments described herein may be configured to generate inspection recipes that have increased sensitivity while decreasing nuisance rate using CA generated from design. In addition, inspection performance can be greatly enhanced by using information in the design data that is not readily available by manually looking at the wafer itself. However, extracting and using this information has, historically, been time consuming to the point of impracticality.

Previously used methods and systems for defining regions of a die to be inspected with different thresholds are also manual, error-prone, do not utilize design information, and impractical when there are millions of relatively small regions that must be inspected with higher sensitivity without incurring a relatively large nuisance rate due to non-critical regions adjoining the critical regions. For example, current methods for manually defining critical regions of a die or regions for which different detection sensitivities are to be applied are cumbersome and error-prone. When these regions become smaller (on the order of about a micron or less) and when there are millions of such regions on a die, it is practically impossible to define them manually. Moreover, current region definition methods that make no use of design data typically result in inspection of critical and non-critical areas with the same sensitivity thereby resulting in de-sensitizing critical defect detection in order to have an acceptable nuisance rate. The embodiments described herein, however, combine the advantages of segmenting based on design context (e.g., cell/structure hierarchy) with knowledge about the imaging characteristics of the inspection system to optimally segment the die surface for detection sensitivity.

As described above, electrical tests or test chips have been used to identify areas of weakness in a device. A manual method may be currently used with inspection systems in which the user defines the various areas on the chip by examining a relatively low resolution and/or a relatively high resolution image of the chip surface using a camera image of the surface. However, using electrical tests and identifying areas of weakness are imprecise because the exact location of the problem on the die is not immediately obvious. Using test chips as a proxy for determining areas of weakness also has limitations because a given device layout may involve complex interactions between process steps and geometry that cannot be anticipated during test chip design. Manual definition of the die regions is subject to user errors and impractical when there are a relatively large number of perhaps substantially small regions whose width and/or height may be on the order of about a micron or less. Therefore, it is not practical to manually define these regions and set thresholds manually for each region. However, offline analysis of the design layout can generate hundreds of context types and millions of microregions in a die, each requiring a different threshold. The embodiments described herein, however, advantageously allow the regions and the thresholds to be determined automatically using the context noise signature repository thereby rendering design-based inspection feasible.

Many existing methods for creating inspection recipes for a wafer (layer) also do not make use of chip design layout information and rely solely on the image characteristics resulting from scanning the wafer in order to determine suitable defect detection thresholds. One disadvantage of such methods is that for every device, the above setup process must be repeated thereby increasing the time to recipe setup. Repeating this setup process for every device is a high burden, particularly for silicon foundries that use the same manufacturing process across hundreds of devices. The embodiments described herein, however, allow recipe learning to be performed on one wafer using design context information coupled with image data from that wafer such as gray level and noise maps. This learning can then be applied to create a recipe automatically for another device without requiring a learning scan for that device.

Another advantage of the embodiments described herein is that different regions of the die can be inspected with different sensitivities that are selected to match the criticality of each region taking into account the noise characteristics of that region. By mapping design context to image properties, the appropriate thresholds for a new device layer can be automatically determined. In this manner, CA may be selected from the design in a manner that improves sensitivity to random defectivity. In addition, CA can be selected from design in a way that improves sensitivity to systematic defectivity.

An additional advantage of the embodiments described herein is that if the inspection system has many imaging modes, the embodiments described herein provide a systematic method for selecting the optimal imaging mode (e.g., the imaging mode that has the best capability of detecting DOI while suppressing nuisance defect detection).

The embodiments described herein may also include storing results of one or more steps of one or more computer-implemented methods described herein in a storage medium. In addition, the embodiments described herein may be configured to store results of one or more steps of one or more computer-implemented methods described herein in a storage medium. The results may include any of the results described herein. The results may be stored in any manner known in the art. The storage medium may include any suitable storage medium known in the art. After the results have been stored, the results can be accessed in the storage medium and used by any of the method or system embodiments described herein, any other method, or any other system. Furthermore, the results may be stored "permanently," "semi-permanently," temporarily, or for some period of time. For example, the storage medium may be random access memory (RAM), and the results may not necessarily persist in the storage medium.

Figure 9:
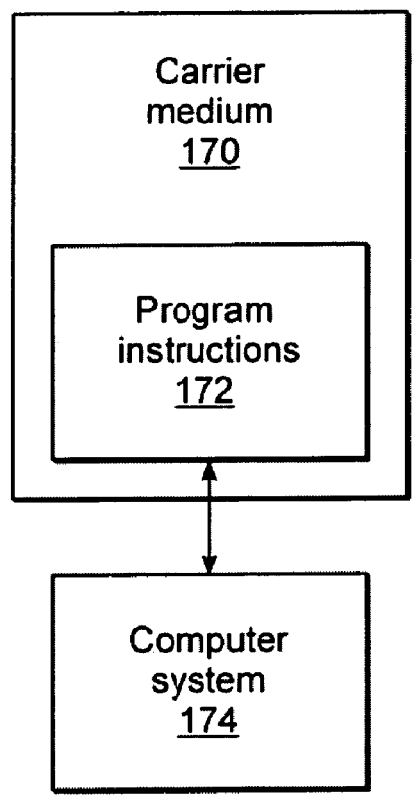
FIG. 9 is a block diagram illustrating one embodiment of a carrier medium that includes program instructions executable on a computer system for performing a computer-implemented method for creating an inspection recipe.

The embodiments described herein can be implemented using software that can execute in either a system computer or a programmable image computer. For example, another embodiment relates to a carrier medium that includes program instructions executable on a computer system for performing a computer-implemented method for creating an inspection recipe. One such embodiment is shown in FIG. 9. For example, as shown in FIG. 9, carrier medium 170 includes program instructions 172 executable on computer system 174 for performing a computer-implemented method for creating an inspection recipe.

The computer-implemented method includes acquiring a first design and one or more characteristics of output of an inspection system for a wafer on which the first design is printed using a manufacturing process. The acquiring step may be performed as described further herein. The inspection system may be further configured as described herein.

The computer-implemented method also includes creating an inspection recipe for a second design using the first design and the one or more characteristics of the output acquired for the wafer on which the first design is printed. The first and second designs are different, and the inspection recipe will be used for inspecting wafers after the second design is printed on the wafers using the manufacturing process. Creating the inspection recipe may be performed according to any embodiments described herein. The computer-implemented method for which the program instructions are executable may include any other step(s) of any other method(s) described herein.

Program instructions 172 implementing methods such as those described herein may be transmitted over or stored on carrier medium 170. The carrier medium may be a transmission medium such as a wire, cable, or wireless transmission link. The carrier medium may also be a storage medium such as a read-only memory, a RAM, a magnetic or optical disk, or a magnetic tape.

The program instructions may be implemented in any of various ways, including procedure-based techniques, component-based techniques, and/or object-oriented techniques, among others. For example, the program instructions may be implemented using Matlab, Visual Basic, ActiveX controls, C, C++ objects, C#, JavaBeans, Microsoft Foundation Classes ("MFC"), or other technologies or methodologies, as desired.

Computer system 174 may take various forms, including a personal computer system, mainframe computer system, workstation, system computer, image computer, programmable image computer, parallel processor, or any other device known in the art. In general, the term "computer system" may be broadly defined to encompass any device having one or more processors, which executes instructions from a memory medium.

Figure 10:
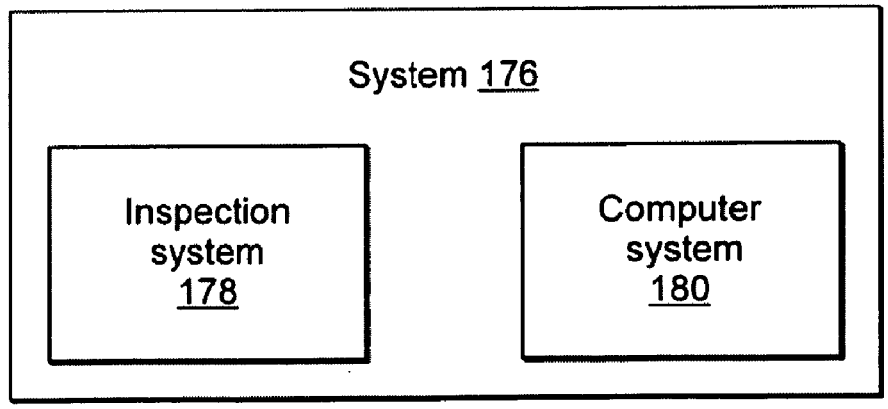
FIG. 10 is a block diagram illustrating one embodiment of a system configured to create an inspection recipe.

An additional embodiment relates to a system configured to create an inspection recipe. One embodiment of such a system is shown in FIG. 10. As shown in FIG. 10, system 176 includes inspection system 178 and computer system 180. The computer system may be configured as a stand-alone system that does not form part of a process, inspection, metrology, review, or other tool. In such an embodiment, the computer system may be configured to receive and/or acquire data or information from other systems (e.g., inspection data from an inspection system) by a transmission medium that may include "wired" and/or "wireless" portions. In this manner, the transmission medium may serve as a data link between the computer system and the other system. In addition, the computer system may send data to the other system via the transmission medium. Such data may include, for example, design data, image data from scanning a wafer, context data, results of the methods described herein, inspection recipes or other recipes, or some combination thereof. In an alternative embodiment, the computer system may be a computer system of the inspection system and as such may form part of or be included in the inspection system.

Inspection system 178 is configured to acquire output for a wafer on which a first design is printed using a manufacturing process. The inspection system may be configured to acquire the output for the wafer as described further herein. The inspection system may be configured to perform any other steps described herein.

Computer system 180 is configured to create an inspection recipe for a second design using the first design and one or more characteristics of the output acquired for the wafer on which the first design is printed. The computer system may be configured to create the inspection recipe for the second design according to any of the embodiments described herein. In some embodiments, the computer system is configured to acquire the first design as described further herein. The first and second designs are different, and the inspection recipe will be used for inspecting wafers after the second design is printed on the wafers using the manufacturing process. The embodiment of the system described above may be further configured as described herein (e.g., to perform any other step(s) of any of the embodiment(s) of the method(s) described herein).

Further modifications and alternative embodiments of various aspects of the invention may be apparent to those skilled in the art in view of this description. For example, systems and methods for creating inspection recipes are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A computer-implemented method for creating an inspection recipe, comprising:

acquiring a first design and one or more characteristics of output of an inspection system for a wafer on which the first design is printed using a manufacturing process; and creating an inspection recipe for a second design using the first design and the one or more characteristics of the output acquired for the wafer on which the first design is printed, wherein the first and second designs are different, wherein the inspection recipe will be used for inspecting wafers after the second design is printed on the wafers using the manufacturing process, wherein said creating comprises creating a context map for the second design using the first design and the one or more characteristics of the output and creating the inspection recipe using the context map such that different sensitivity thresholds for de ect detection are applied to output acquired for at least two different contexts in the second design, and wherein said creating the inspection recipe is performed using a computer system.

2. The method of claim 1, wherein said creating the inspection recipe further comprises creating the inspection recipe using the first design, the one or more characteristics of the output acquired for the wafer on which the first design is printed, and one or more characteristics of output of the inspection system for a wafer on which the second design is printed.

3. The method of claim 1, wherein said creating the inspection recipe further comprises creating a classifier that maps different portions of the first design and the one or more characteristics of the output acquired for the wafer on which the first design is printed, acquiring output of the inspection system for a wafer on which the second design is printed, determining one or more characteristics of the output acquired for the wafer on which the second design is printed, and assigning a context identity to different portions of the second design using the one or more characteristics of the output acquired for the wafer on which the second design is printed and the classifier constructed using the first design.

4. The method of claim 3, wherein the results of classification of contexts on the second design are stored in a context map and used for subsequent inspections of that design without requiring use of the classifier on subsequent wafers inspected.

5. The method of claim 1, wherein said creating the inspection recipe further comprises storing the context map in the inspection recipe such that inspection is performed using the context map.

6. The method of claim 1, further comprising using the context map to create a defect review recipe for the second design.

7. The method of claim 1, wherein said creating the context map comprises creating the context map by segmenting a die into different region types based on hierarchy of cells, structures, or some combination thereof in the second design.

8. The method of claim 1, wherein the one or more characteristics of the output comprise one or more characteristics of noise in the output.

9. The method of claim 1, further comprising determining multi-die statistics for different context types in the first design using the one or more characteristics of the output and splitting at least one of the different context types into context sub-types based on appearance and noise levels of the output, wherein said creating the inspection recipe further comprises creating the inspection recipe using the first design, the one or more characteristics of the output, and the context sub-types.

10. The method of claim 1, wherein the context map comprises different context types in the second design, and wherein creating the context map comprises merging different context types that have similar one or more characteristics of the output and similar noise characteristics of the output.

11. The method of claim 1, wherein said creating the inspection recipe further comprises creating the inspection recipe using the context map such that defects detected by inspecting the wafers on which the second design is printed are classified based on the context map.

12. The method of claim 1, wherein said creating the inspection recipe further comprises creating the inspection recipe using the context map such that defects detected by inspecting the wafers on which the second design is printed are grouped based on the context map.

13. The method of claim 1, wherein said creating the inspection recipe further comprises creating the inspection recipe using the context map such that systematic defect mechanisms in the second design are detected using results of inspecting the wafers on which the second design is printed and the context map.

14. The method of claim 1, wherein said creating the inspection recipe further comprises selecting an optics mode for the inspection recipe using a scoring function based on the first design, the one or more characteristics of the output, and defect detectability in different optics modes for different design contexts present in the first design.

15. The method of claim 1, wherein said acquiring comprises acquiring the first design and the one or more characteristics of the output from a design context-based repository in which the first design and the one or more characteristics of the output are stored.

16. The method of claim 1, wherein the inspection system is the inspection system for which an inspection recipe is being created.

17. The method of claim 1, wherein the output of the inspection system for the wafer on which the first design is printed is acquired using an optics mode of the inspection system different than an optics mode of the inspection system for which the recipe is being created.

18. The method of claim 1, wherein the inspection system, the output of which is acquired for the wafer on which the first design is printed, has a different platform than an inspection system for which the recipe is being created.

19. A carrier medium, comprising program instructions executable on a computer system for performing a computer-implemented method for creating an inspection recipe, wherein the carrier medium is a storage medium, and wherein the computer-implemented method comprises:

acquiring a first design and one or more characteristics of output of an inspection system for a wafer on which the first design is printed using a manufacturing process; and creating an inspection recipe for a second design using the first design and the one or more characteristics of the output acquired for the wafer on which the first design is printed, wherein the first and second designs are different, wherein the inspection recipe will be used for inspecting wafers after the second design is printed on the wafers using the manufacturing process, and wherein said creating comprises creating a context map for the second design using the first design and the one or more characteristics of the output and creating the inspection recipe using the context map such that different sensitivity thresholds for defect detection are applied to output acquired for at least two different contexts in the second design.

20. A system configured to create an inspection recipe, comprising:
   an inspection system configured to acquire output for a wafer on which a first design is printed using a manufacturing process; and
   a computer system configured to create an inspection recipe for a second design using the first design and one or more characteristics of the output acquired for the wafer on which the first design is printed, wherein the first and second designs are different, wherein the inspection recipe will be used for inspecting wafers after the second design is printed on the wafers using the manufacturing process, the one or more characteristics of the output and creating the inspection recipe using the context map such that different sensitivity thresholds for defect detection are applied to output acquired for at least two different contexts in the second design.

* * * * *